United States Patent
Kim et al.

(10) Patent No.: US 10,991,790 B2
(45) Date of Patent: Apr. 27, 2021

(54) SUBSTRATE AND DISPLAY DEVICE INCLUDING THE SAME

(71) Applicant: Samsung Display Co., Ltd., Yongin-si (KR)

(72) Inventors: Youngsu Kim, Gunpo-si (KR); Dawoon Kim, Yongin-si (KR); Cheuljin Park, Seoul (KR); Sukwon Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/595,357

(22) Filed: Oct. 7, 2019

(65) Prior Publication Data

US 2020/0161404 A1    May 21, 2020

(30) Foreign Application Priority Data

Nov. 19, 2018 (KR) .................. 10-2018-0142903

(51) Int. Cl.
*H01L 27/32* (2006.01)

(52) U.S. Cl.
CPC ...... *H01L 27/3276* (2013.01); *H01L 27/3258* (2013.01)

(58) Field of Classification Search
CPC .................. H01L 27/3258; H01L 27/3276
See application file for complete search history.

(56) References Cited

U.S. PATENT DOCUMENTS

| | | | |
|---|---|---|---|
| 2013/0321251 A1* | 12/2013 | Kang | ............... G02F 1/136286 345/87 |
| 2014/0184057 A1* | 7/2014 | Kim | ................... H05B 33/145 313/504 |
| 2018/0110122 A1 | 4/2018 | Lee | |
| 2018/0120975 A1 | 5/2018 | Kim et al. | |
| 2018/0120987 A1 | 5/2018 | Kim et al. | |

FOREIGN PATENT DOCUMENTS

| | | |
|---|---|---|
| KR | 10-2012-0035744 A | 4/2012 |
| KR | 10-2018-0041301 A | 4/2018 |
| KR | 10-2018-0049464 A | 5/2018 |
| KR | 10-2018-0049465 A | 5/2018 |

* cited by examiner

*Primary Examiner* — Thomas L Dickey
(74) *Attorney, Agent, or Firm* — Lewis Roca Rothgerber Christie LLP

(57) ABSTRACT

A display device includes: a substrate having a first surface, a second surface opposite to the first surface, and an inner side surface defining through holes; a first wiring and a second wiring disposed on the first surface; and a first conductor and a second conductor disposed in one of the through holes. The first conductor is connected to the first wiring, the second conductor is connected to the second wiring, and the first and second conductors are insulated from each other.

23 Claims, 31 Drawing Sheets

SUBSTRATE AND DISPLAY DEVICE INCLUDING THE SAME

CROSS-REFERENCE TO RELATED APPLICATION

This application claims priority to and the benefit of Korean Patent Application No. 10-2018-0142903, filed on Nov. 19, 2018, in the Korean Intellectual Property Office (KIPO), the disclosure of which is incorporated by reference herein in its entirety.

BACKGROUND

1. Field

Embodiments relate to a substrate and a display device including the substrate.

2. Discussion of Related Art

Display devices such as liquid crystal display (LCD) devices, plasma display devices (PDP), electrophoretic display devices, organic light emitting diode (OLED) display devices, field emission display (FED) devices, and electrophoretic display devices are currently being utilized.

For example, an OLED display device includes two electrodes and an organic light emitting layer disposed between the two electrodes. Electrons injected from one electrode and holes injected from the other electrode are combined in the organic light emitting layer to form excitons, and the excitons may emit light by emitting energy (e.g., when transitioning from an excited state to a ground state).

The OLED display device has a self-luminance characteristic, and unlike LCD devices, a separate light source is not required. Accordingly, thickness and weight of the display device may be reduced. In addition, OLED display devices are attracting attention as next generation display devices because they exhibit high quality characteristics such as low power consumption, high luminance, and/or quick response speed.

In order to drive an OLED in the OLED display device, a printed circuit board (PCB) is coupled to a peripheral area of a substrate, and signals necessary for driving (e.g., driving the OLED) is received through the PCB.

A structure in which a part of the PCB attached to the substrate is bent is largely (e.g., commonly) utilized. In this case, cracks may occur (e.g., may be generated) on a metal wiring located on the bent PCB. In addition, a bezel of the display device may be increased by the bent PCB.

In order to reduce a dead space of the display panel, a connection wiring that extends from a display area may be connected to the PCB that is disposed on a rear surface of the display panel through a through hole defined (e.g., located) at the peripheral area.

However, a diameter or breadth of the through hole and a distance between the through holes may be greater than a line width of the connection wiring and a separation distance between the connection wirings. Accordingly, a density of the connection wirings, that is, the number of connection wirings that may be disposed apart from each other within a set or predetermined distance, may be limited by the number of through holes.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of the subject matter disclosed herein.

SUMMARY

An aspect according to embodiments of the present disclosure may be directed to a display device capable of increasing a density of connection wirings.

According to an embodiment, a display device includes: a substrate having a first surface, a second surface opposite to the first surface, and an inner side surface defining a plurality of through holes; a first wiring and a second wiring both on the first surface; and a first conductor and a second conductor both in one of the plurality of through holes. The first conductor is connected to the first wiring, the second conductor is connected to the second wiring, and the first and second conductors are insulated from each other.

The substrate may include a display area including a plurality of pixels and a peripheral area around the display area, the peripheral area being free of pixels, the through hole may be at the peripheral area, and the first and second wirings may be connected to the plurality of pixels.

The display device may further include a printed circuit board on the second surface, and the first and second conductors may be connected to the printed circuit board.

The display device may further include a third wiring and a fourth wiring both on the second surface. The first conductor may be connected to the third wiring, and the second conductor may be connected to the fourth wiring.

The display device may further include an insulator in the through hole and dividing the through hole in a plan view.

The insulator may have an upper surface and a lower surface, each being parallel to the first surface of the substrate, first and second side surfaces contacting the inner side surface of the substrate, and third and fourth side surfaces facing the inner side surface of the substrate.

A distance between the upper surface and the lower surface of the insulator may be substantially equal to a distance between the first surface and the second surface of the substrate.

A distance between the upper surface and the lower surface of the insulator may be greater than a distance between the first surface and the second surface of the substrate.

The through hole may have: a first connection hole defined by the third side surface of the insulator and the inner side surface of the substrate; and a second connection hole defined by the fourth side surface of the insulator and the inner side surface of the substrate. The first conductor may be in the first connection hole, and the second conductor may be in the second connection hole.

The display device may further include: an insulating layer on the third side surface of the insulator, the fourth side surface of the insulator, and the inner side surface of the substrate. The through hole may have: a third connection hole defined by the third side surface of the insulator and the insulating layer on the inner side surface of the substrate; and a fourth connection hole defined by the fourth side surface of the insulator and the insulating layer on the inner side surface of the substrate. The first conductor may be in the third connection hole, and the second conductor may be in the fourth connection hole.

The insulator may include: a first portion extending from a center of the through hole in a first direction and contacts the inner side surface of the substrate in a plan view; and a second portion extending from the center of the through hole in a second direction different from the first direction, and contacts the inner side surface of the substrate in a plan view.

The first direction and the second direction may be opposite to each other.

The insulator further may include: a third portion extending from the center of the through hole in a third direction different from the first and second directions, and contacts the inner side surface of the substrate in a plan view.

The insulator may include: a fourth portion extending from the center of the through hole in a fourth direction different from the first, second, and third directions, and contacts the inner side surface of the substrate in a plan view.

The inner side surface of the substrate may have a shape of an ellipse in a plan view, and the first and second directions may be parallel to a major axis direction of the ellipse.

The inner side surface of the substrate may have a shape of a circle in a plan view.

A side surface of the insulator contacting the inner side surface of the substrate may include a protruding portion protruding toward the substrate in a plan view.

The inner side surface of the substrate may be perpendicular to the first surface and the second surface in a cross-sectional view.

The inner side surface of the substrate may be inclined with respect to the first surface and the second surface in a cross-sectional view.

The inner side surface of the substrate around the through hole may have a convex shape in a cross-sectional view.

According to another embodiment, a substrate that has a first surface, a second surface opposite to the first surface, and an inner side surface defining a plurality of through holes includes: a first wiring and a second wiring both on the first surface; and a third wiring and a fourth wiring both on the second surface; an insulator in the through hole and dividing the through hole in a plan view; and a first conductor and a second conductor both in one of the plurality of through holes and insulated from each other by the insulator. The first conductor connects the first wiring and the third wiring, and the second conductor connects the second wiring and the fourth wiring.

The substrate may be a printed circuit board.

The substrate may be a substrate of a display panel.

The foregoing is illustrative only and is not intended to be in any way limiting. In addition to the illustrative aspects, embodiments and features described above, additional aspects, embodiments and features will become apparent by reference to the drawings and the following detailed description.

BRIEF DESCRIPTION OF THE DRAWINGS

A more complete appreciation of the present invention will become more apparent by describing in more detail embodiments thereof with reference to the accompanying drawings, wherein.

DETAILED DESCRIPTION

Figure 1:
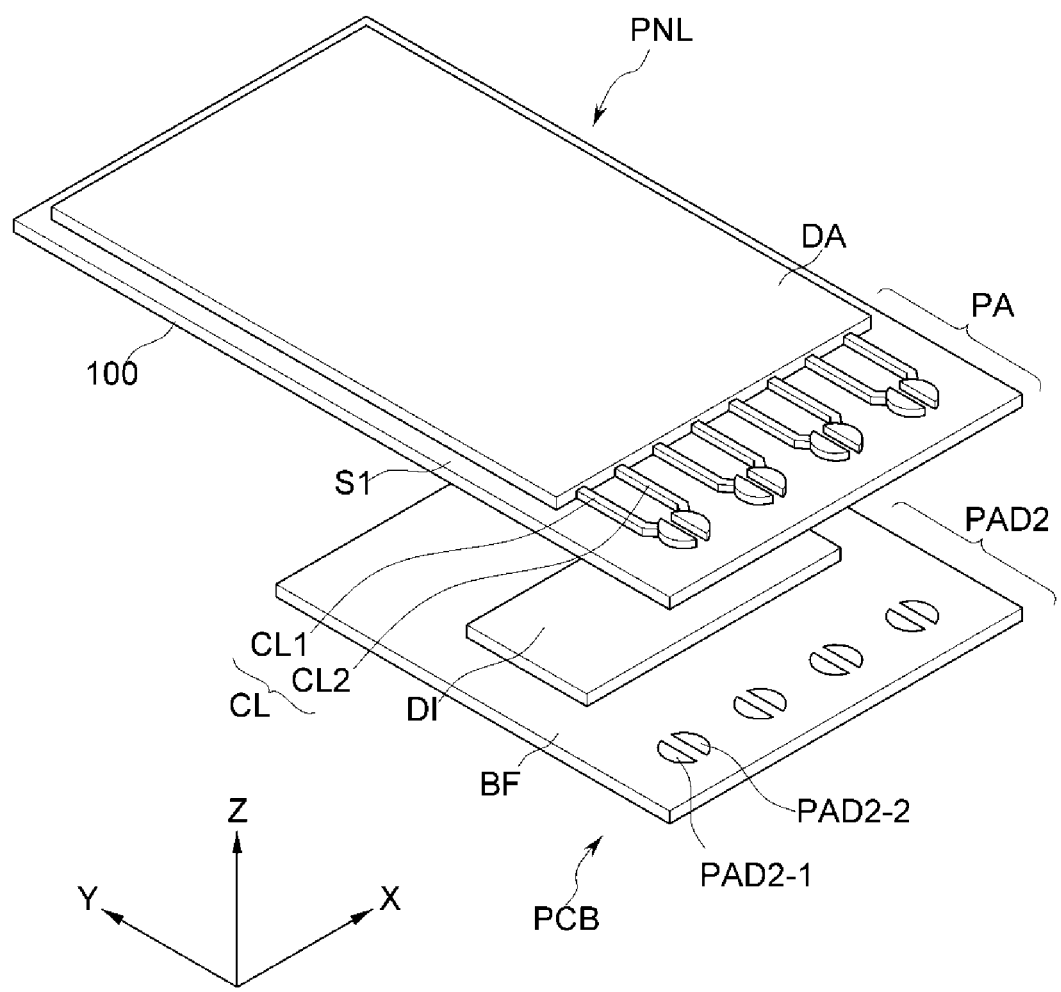
FIG. 1 is a schematic exploded perspective view illustrating a display device according to an embodiment.

Embodiments will now be described more fully hereinafter with reference to the accompanying drawings. Although the invention may be modified in various suitable manners and have several embodiments, example embodiments are illustrated in the accompanying drawings and will be mainly described in the specification. However, the scope of the present invention is not limited to the embodiments and should be construed as including all the changes, equivalents and substitutions included in the spirit and scope of the present invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, one or more intervening layers, areas, or plates should be absent therebetween. In addition, when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, one or more intervening layers, areas, or plates should be absent therebetween.

The spatially relative terms "below", "beneath", "lower", "above", "upper" and the like, may be utilized herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and accordingly the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. In addition, it will be understood that the terms "comprises," "comprising," "includes" and/or "including," when used in this specification, specify the presence of stated features, integers, steps, operations, elements, components, and/or groups, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Accordingly, "a first element" discussed below could be termed "a second element" or "a third element," and "a second element" and/or "a third element" may be termed similarly without departing from the teachings herein.

The term "about," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. In addition, it will be understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe the embodiments. Like reference numerals refer to like elements throughout the specification.

Hereinafter, a display device according to an embodiment will be described with reference to FIGS. 1 and 2A.

Figure 2A:
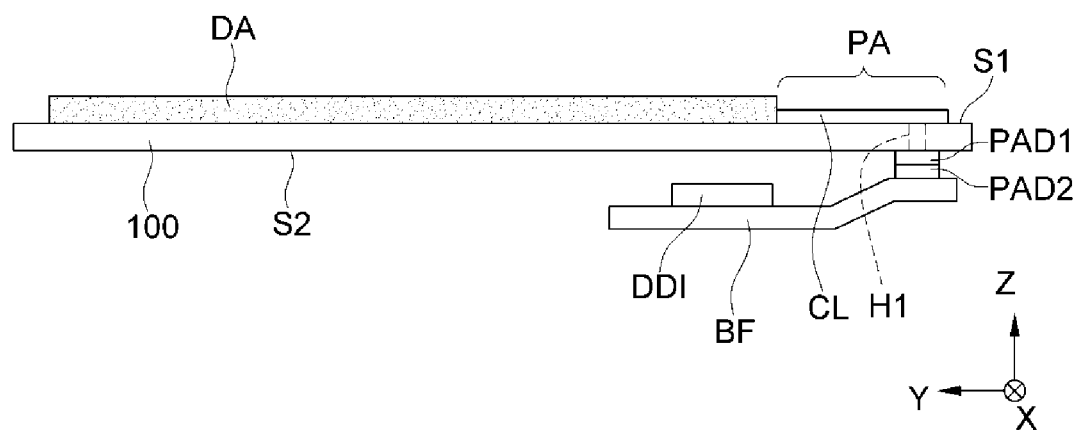
FIGS. 2A and 2B are schematic side views illustrating display devices according to embodiments.

FIG. 1 is a schematic exploded perspective view illustrating a display device according to an embodiment, and FIG. 2A is a schematic side view illustrating a display device according to an embodiment.

Referring to FIGS. 1 and 2A, the display device according to an embodiment includes a display panel PNL and a printed circuit board (PCB) bonded thereto. A first pad portion PAD1 located on a substrate 100 of the display panel PNL may directly contact a second pad portion of the PCB at a second surface S2 which is a lower surface of the substrate 100. In such an embodiment, a plurality of connection wirings CL connected to the display area DA may be electrically connected to the first pad portion PAD1 through a plurality of through holes H1 located at a peripheral area PA of the substrate 100. The detailed coupling structure of the first pad portion PAD1 and the second pad portion PAD2 according to an embodiment will be described below.

According to the present embodiment, because the second pad portion PAD2 of the PCB directly contacts the first pad portion PAD1 at the second surface S2 which is the lower surface of the substrate 100, a structure in which the substrate 100 of the display panel PNL and a base film BF of the PCB are bend to contact each other may be omitted (e.g., not needed).

The display panel PNL according to the present embodiment may include the display area DA and the peripheral area PA. The display area DA and the peripheral area PA refer to areas located on the substrate 100.

The display area DA is an area for displaying images, and a plurality of laminated structures for emitting light may be disposed at the display area DA. The structure of the display area DA will be described in more detail below.

The peripheral area PA is an area located at the periphery of the display area DA, and the peripheral area PA may be coupled with the PCB that transmits signals from the outside. In such an embodiment, the plurality of connection wirings CL and the first pad portion PAD1 may be disposed at the peripheral area PA, and the first pad portion PAD1 may be coupled to the second pad portion PAD2 of the PCB.

The plurality of connection wirings CL may be disposed at the peripheral area PA. The display area DA and the first pad portion PAD1 may be connected to each other by the plurality of connection wirings CL. In addition, the plurality of connection wirings CL may be connected to a plurality of signal lines disposed at the display area DA.

In such an embodiment, the plurality of connection wirings CL may be connected to the first pad portion PAD1 through the plurality of through holes H1 located at the peripheral area PA. That is, the plurality of connection wirings CL may be electrically connected to the first pad portion PAD1 that is disposed at the second surface S2, which is the lower surface of the substrate 100, through the plurality of through holes H1. In such an embodiment, at least two connection wirings CL1 and CL2 may be electrically connected to the first pad portion PAD1 through one through hole H1.

The first pad portion PAD1 may include a plurality of first pad terminals (refer to PAD1-1 and PAD1-2 in FIG. 5C) disposed at the second surface S2 of the substrate 100. The plurality of first pad terminals PAD1-1 and PAD1-2 may directly contact a plurality of second pad terminals PAD2-1 and PAD2-2 of the second pad portion PAD2. The plurality of first pad terminals PAD1-1 and PAD1-2 may be connected to the plurality of connection wirings CL through the plurality of through holes H1. In such an embodiment, at least two first pad terminals PAD1-1 and PAD1-2 may be connected to at least two connection wirings CL1 and CL2 through one through hole H1.

Accordingly, signals transmitted from the PCB may be transmitted sequentially to the first pad portion PAD1, the connection wiring CL, and the display area DA. The structure of the first pad terminals PAD1-1 and PAD1-2, the connection wiring CL and the through hole H1 will be described below in more detail.

The PCB may be coupled to the first pad portion PAD1 of the peripheral area PA of the substrate 100 to transmit a signal (e.g., necessary) for driving the display panel PNL to the display panel PNL. In such an embodiment, a driving chip DDI may be mounted on the base film BF, and the driving chip DDI may be utilized to drive the display panel PNL. FIGS. 1 and 2A show an example in which the driving chip DDI is disposed on an upper surface of the base film BF so as to face the second surface S2 of the substrate 100.

Figure 2B:
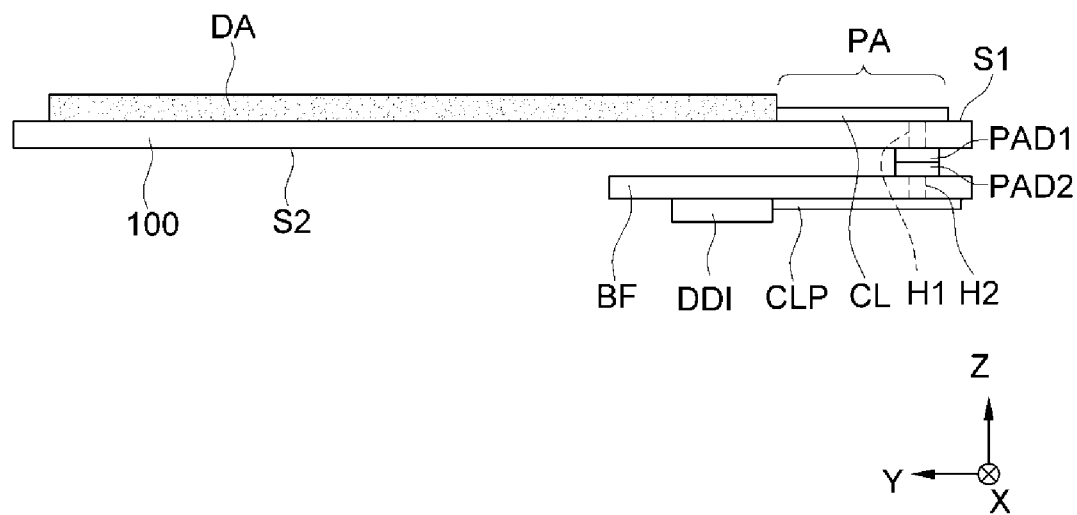

However, embodiments of the present disclosure are not limited thereto. As illustrated in FIG. 2B, the driving chip DDI may be disposed at a lower surface of the base film BF of the PCB. In such an embodiment, a terminal wiring CLP connected to the driving chip DDI may be disposed at the lower surface of the base film BF, and a through hole H2 defined (e.g., formed) through the base film BF may be defined (e.g., formed) at the PCB. Accordingly, the terminal wiring CLP may be connected to the second pad terminals PAD2-1 and PAD2-2 through the through hole H2. That is, the driving chip DDI may be electrically connected to the second pad terminals PAD2-1 and PAD2-2 through the terminal wiring CLP. The second pad terminals PAD2-1 and PAD2-2, the terminal wiring CLP and the through hole H2 may have structures substantially the same as those of the first pad terminals PAD1-1 and PAD1-2, the connection wiring CL and the through hole H1 (to be described in more detail below).

In such an embodiment, the second pad portion PAD2 may be disposed at one end portion of the base film BF of the PCB, and the second pad portion PAD2 may be coupled to the first pad portion PAD1 of the substrate 100. The second pad portion PAD2 may directly contact the first pad portion PAD1 to transmit a signal of a driving chip DDI to the first pad portion PAD1 of the substrate 100. According to the present embodiment, the PCB is attached to the second surface S2 of the substrate 100, not to the first surface S1. That is, the PCB is not attached to the upper surface of the substrate 100 of the display panel PNL, but may be directly attached to the lower surface of the substrate 100.

For example, when the PCB is attached to the first surface S1, a remaining portion of the PCB except for the portion attached to the substrate 100 is bent so as to face the second surface S2, which is the lower surface of the substrate 100. However, according to the present embodiment, because the PCB is directly attached to the second surface S2, which is the lower surface of the substrate 100, not the first surface S1, a bending area of the PCB is removed (e.g., eliminated), a material cost of the PCB may be reduced, and a dead space that may be present at the display device may be reduced.

In such an embodiment, the second pad portion PAD2 is disposed to face the first pad portion PAD1, and the second pad portion PAD2 may include the plurality of second pad terminals PAD2-1 and PAD2-2. The plurality of second pad terminals PAD2-1 and PAD2-2 may be disposed in correspondence with the plurality of first pad terminals PAD1-1 and PAD1-2 disposed at the first pad portion PAD1. The plurality of first pad terminals PAD1-1 and PAD1-2 of the first pad portion PAD1 and the plurality of second pad terminals PAD2-1 and PAD2-2 of the second pad portion PAD2 are disposed in a manner corresponding to each other, and thus each of the plurality of first pad terminals PAD1-1 and PAD1-2 and each of the plurality of second pad terminals PAD2-1 and PAD2-2 may contact each other in a one-to-one correspondence.

Hereinafter, the display panel PNL will be described in more detail with reference to FIGS. 3 and 4.

Figure 3:
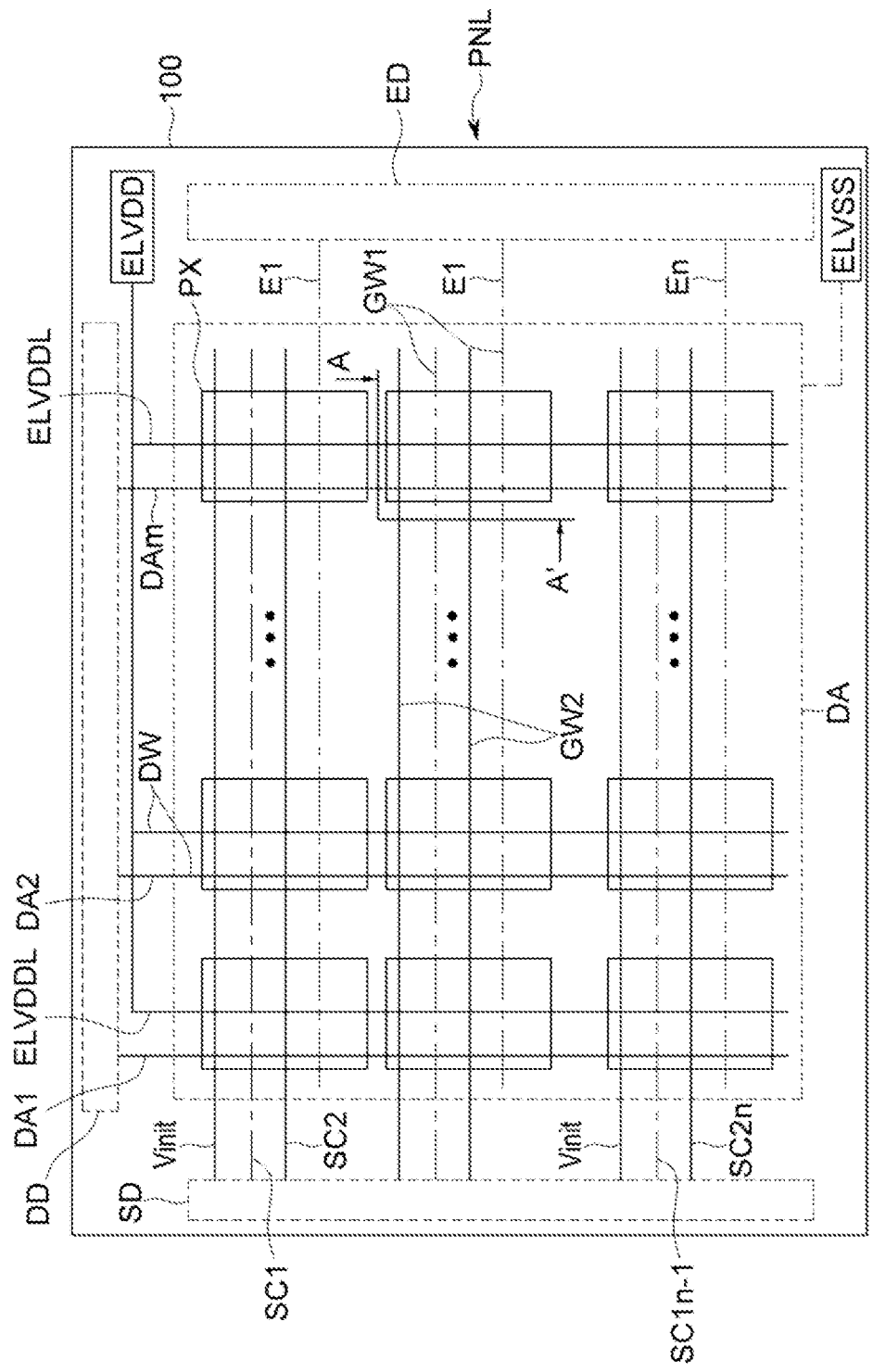
FIG. 3 is a schematic view illustrating a display area of FIG. 1.
Figure 4:
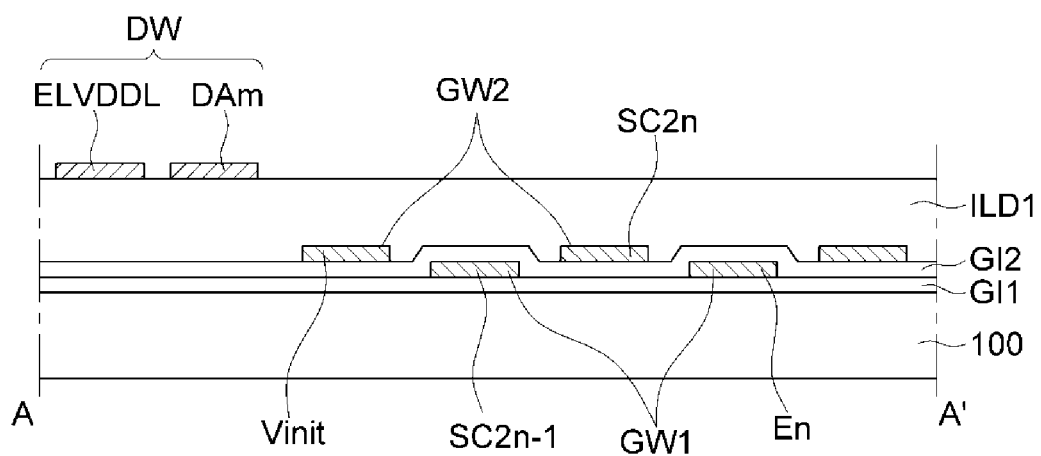
FIG. 4 is a cross-sectional view taken along the line A-A' of FIG. 3.

FIG. 3 is a schematic view illustrating a display area of FIG. 1, and FIG. 4 is a cross-sectional view taken along the line A-A' of FIG. 3.

According to the present embodiment, the display panel PNL includes first gate wirings GW1, second gate wirings GW2, data wirings DW, a display area DA, and a pixel (e.g., a plurality of pixels) PX. In FIGS. 3 and 4, the gate wirings are described as including first gate wirings GW1 and second gate wirings GW2 that are located in different layers, but embodiments of the present disclosure are not limited thereto. In an embodiment, all of the gate wirings may be disposed on one layer.

A gate driver SD applies scan signals sequentially to first scan lines SC2 to SC2n or second scan lines SC1 to SC1n−1 included in the first gate lines GW1 or the second gate lines GW2 in response to a control signal applied from an external control circuit, such as a timing controller, where n is a natural number equal to or greater than 1, and so on.

The pixel PX is selected by the scan signal and sequentially (e.g., subsequently) receives a data signal. In other words, a scan signal is sent to a selected pixel PX and subsequently, a data signal is sent to the selected pixel PX. In such an embodiment, the gate driver SD illustrated in FIG. 3 may be disposed in the driving chip DDI of the PCB.

The first gate wirings GW1 are located on the substrate 100 with the first insulating layer GI1 therebetween, and extend in a first direction. The first gate wirings GW1 include a second scan line SC1n−1 and emission control lines E1 to En.

The second scan line SC1n−1 is connected to the gate driver SD, and receives the scan signal from the gate driver SD. The emission control line En is connected to an emission control driver ED and receives an emission control signal from the emission control driver ED. In such an embodiment, the emission control driver ED illustrated in FIG. 3 may be formed in the driver chip DDI of the PCB, similar to the gate driver SD.

The second gate wirings GW2 are located on the first gate wirings GW1 with a second insulating layer GI2 therebetween, and extend in the first direction. The second gate wirings GW2 include a first scan line SC2n and an initialization power line Vinit.

The first scan line SC2n is connected to the gate driver SD, and receives the scan signal from the gate driver SD. The initialization power line Vinit is connected to the gate driver SD, and receives an initialization power from the gate driver SD.

The emission control driver ED applies the emission control signal sequentially to the emission control line En in response to a control signal applied from the outside, such as a timing control unit. Then, light emission of the pixel PX is controlled by the emission control signal.

That is, the emission control signal controls an emission time of the pixel PX. However, the emission control driver ED may be omitted (e.g., not included) depending on the internal structures of the pixel PX.

A data driver DD applies the data signal to a data line DAm from among the data wirings DW in response to a control signal applied from the outside, such as a timing controller. The data signal applied to the data line DAm is applied to the pixel PX that is selected by the scan signal (e.g., to the selected pixel PX that receives the scan signal) each time the scan signal is applied to the first scan line SC2n or the second scan line SC1n−1. Then, the pixel PX is charged with a voltage corresponding to the data signal, and emits light with a luminance corresponding thereto. In such an embodiment, the data driver DD illustrated in FIG. 3 may be formed in the driving chip DDI of the PCB.

The data wirings DW are located on the second gate lines GW2 with a third insulating layer ILD1 therebetween, and extend in a second direction that intersects (e.g., crosses) the first direction. The data wirings DW include the data lines DA1 to DAm and a driving power line ELVDDL. The data line DAm is connected to the data driver DD, and receives the data signal from the data driver DD. The driving power line ELVDDL is connected to an external first power source ELVDD (to be described in more detail below), and receives a driving power from the first power source ELVDD.

The display area DA includes the plurality of pixels PX located at intersections of the first gate wirings GW1, the second gate wirings GW2 and the data wirings DW. In such an embodiment, each pixel PX includes an OLED that emits light with a luminance corresponding to a driving current that corresponds to the data signal, and a pixel circuit for controlling the driving current flowing through the OLED.

The pixel circuit is connected to each of the first gate wirings GW1, the second gate wirings GW2 and the data wirings DW, and the OLED is connected to the pixel circuit. According to an embodiment, the pixel PX is described as an OLED, but the pixel PX applied to the display device according to embodiments of the present disclosure are not limited thereto, and may be, for example, a liquid crystal display element and/or an electrophoretic display element.

The OLED of the pixel PX of the display area DA is connected to the external first power source ELVDD and also to a second power source ELVSS with the pixel circuit therebetween. Each of the first power source ELVDD and the second power source ELVSS applies the driving power and a common power respectively to the pixel PX of the display area DA, and the pixel PX emits light at a luminance corresponding to the driving current that flows through the OLED from the first power source ELVDD in response to the data signal according to the driving power and the common power applied to the pixel PX.

Hereinafter, referring to FIGS. 5A-5C, a connection structure of the plurality of connection wirings CL, the plurality of through holes H1, and the first pad portion PAD1 disposed at the peripheral area PA will be described in more detail.

Figure 5A:
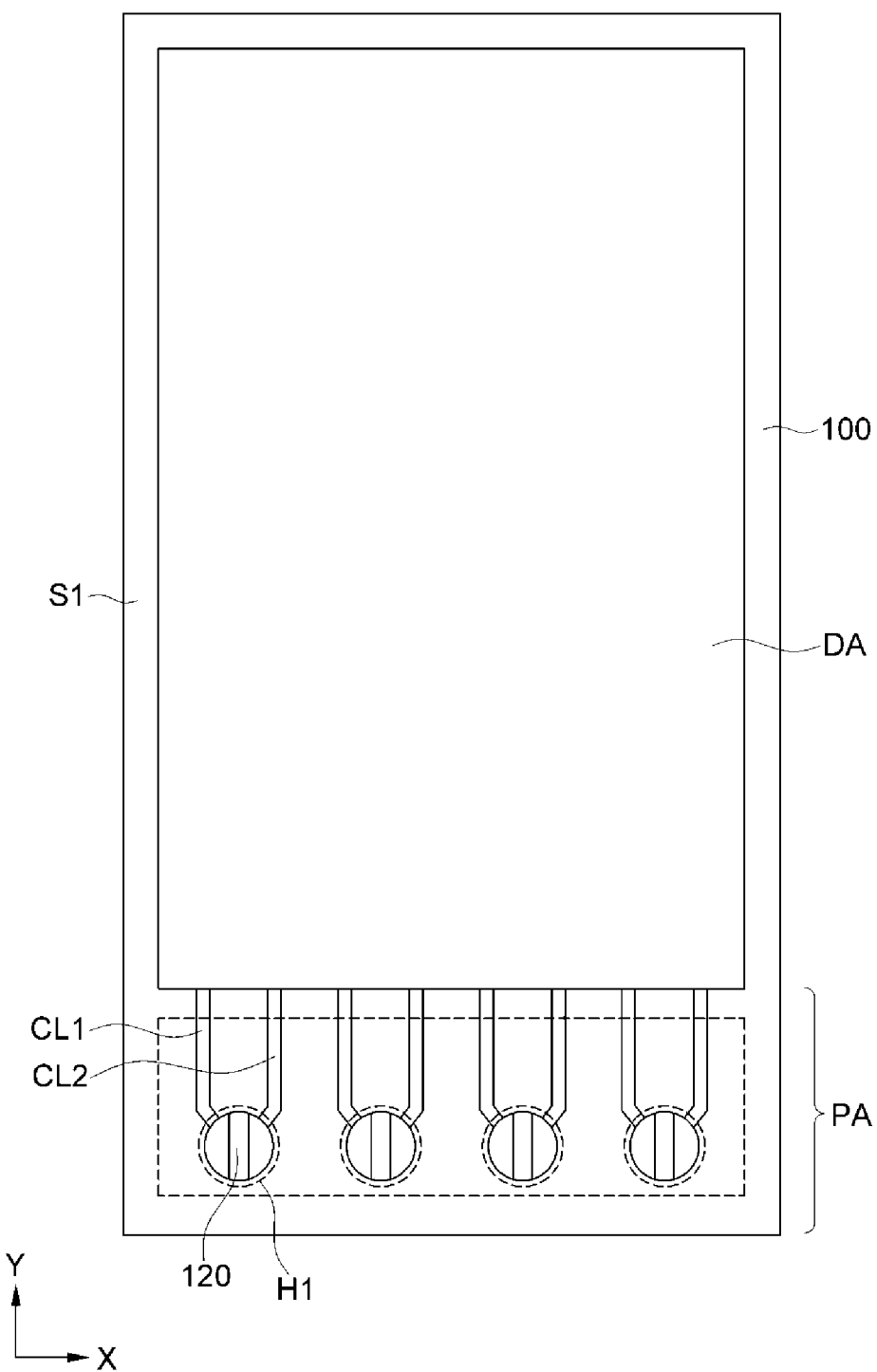
FIG. 5A is a schematic plan view illustrating a display device according to an embodiment.
Figure 5B:
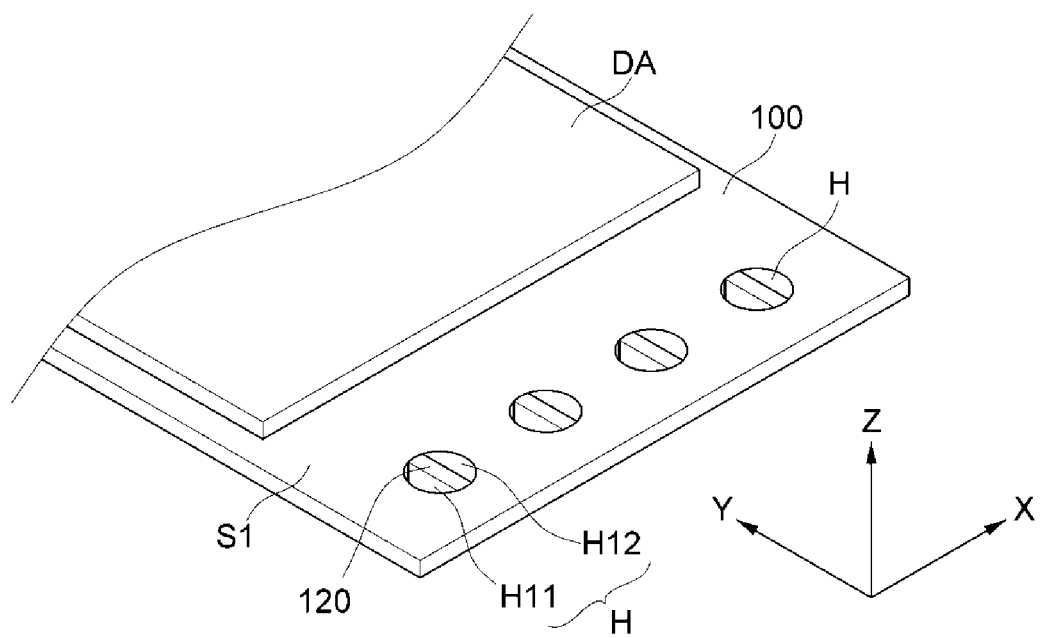
FIG. 5B is a schematic view illustrating a substrate having a plurality of through holes defined thereat.
Figure 5C:
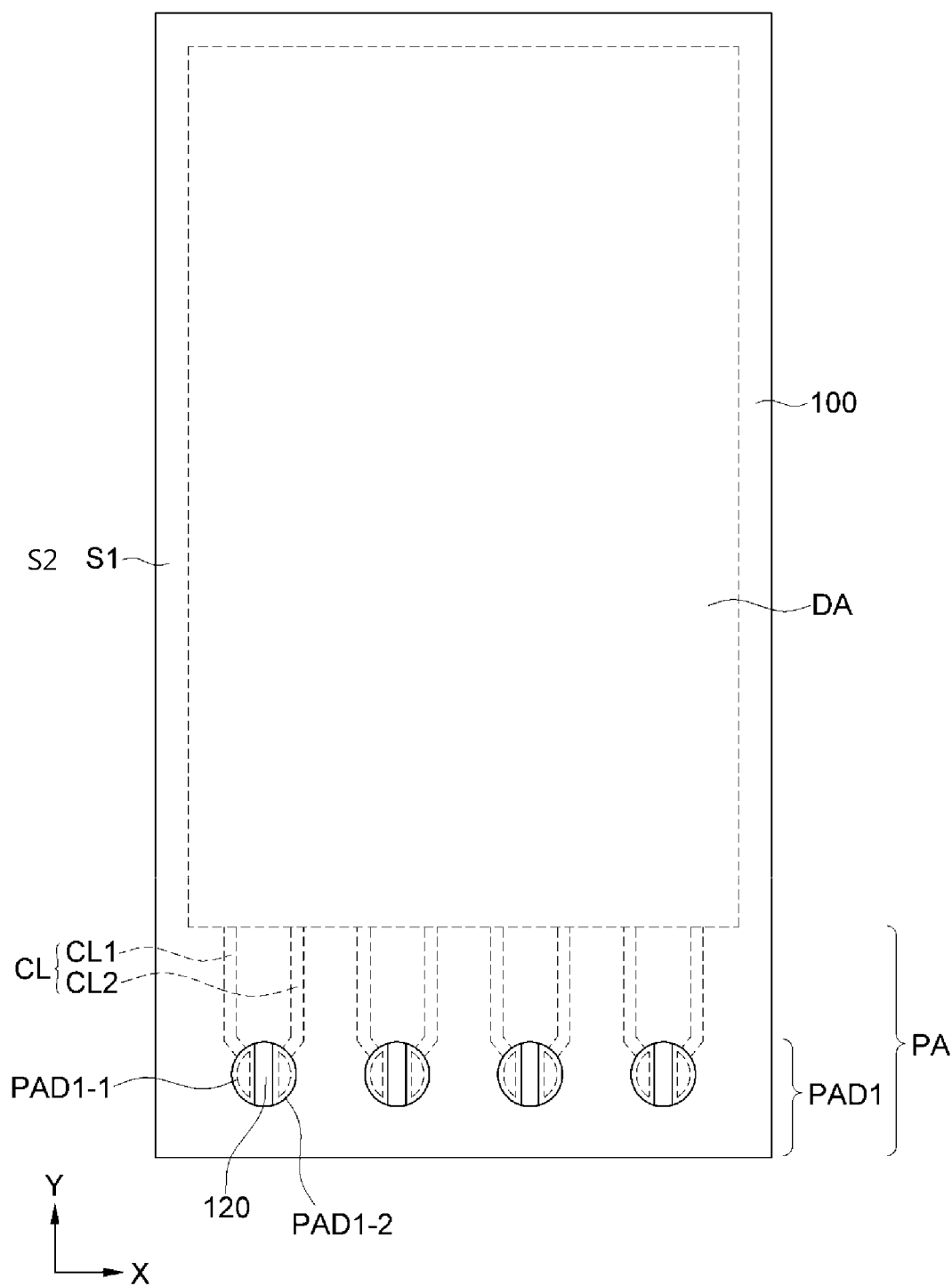
FIG. 5C is a bottom view illustrating a display device according to an embodiment.

FIG. 5A is a schematic plan view illustrating a display device according to an embodiment, FIG. 5B is a schematic view illustrating a substrate having a plurality of through holes defined thereat, and FIG. 5C is a bottom view illustrating a display device according to an embodiment.

Referring to FIGS. 5A, 5B, and 5C, the plurality of connection wirings CL1 and CL2 may be disposed at the first surface S1 of the substrate 100. The plurality of connection wirings CL1 and CL2 may be disposed at the first surface S1 of the substrate 100 which is the same surface as the display area DA. That is, the plurality of connection wirings CL1 and CL2 and the display area DA may be disposed at the first surface S1, which is an upper surface of the substrate 100. However, the plurality of connection wirings CL1 and CL2 may be disposed at the peripheral area PA located around the display area DA.

In such an embodiment, each of the plurality of connection wirings CL1 and CL2 may extend in parallel in the second direction (Y-axis). Each of the plurality of connection wirings CL1 and CL2 may be bent while extending along the second direction (Y-axis). In FIG. 5A, several connection wirings CL1 and CL2 are illustrated for convenience of description, but the number of connection wirings CL1 and CL2 may be in several tens or hundreds.

As described above, the plurality of connection wirings CL1 and CL2 may be connected to the plurality of signal lines (see FIG. 3) disposed at the display area DA, and output signals transmitted from the PCB to the plurality of signal lines of the display area DA. Accordingly, the plurality of connection wirings CL1 and CL2 may serve to electrically connect the display area DA and the PCB.

In the present embodiment, the plurality of through holes H1 defined (e.g., formed) through the substrate 100 may be disposed at the peripheral area PA of the substrate 100. In FIG. 5B, the plurality of connection wirings CL1 and CL2 disposed at the peripheral area PA are omitted (e.g., not shown) for convenience of description. Opposite ends of the plurality of through holes H1 may reach the first surface S1 and the second surface S2 of the substrate 100, respectively. The plurality of through holes H1 may extend along a third direction (Z-axis) that crosses (e.g., is perpendicular to) surface directions of the first surface S1 and the second surface S2.

The plurality of through holes H1 may be spaced apart from each other along the first direction (X-axis), for example. In such an embodiment, each of the through holes H1 may be arranged corresponding to two or more connection wirings CL1 and CL2. For example, two connection wirings CL1 and CL2 and one through hole H (including H11 and H12) may be arranged to overlap each other. Similar to the connection wirings CL1 and CL2, several through holes H are illustrated in FIG. 5B for convenience of description, but the number of through holes H may be in several tens or several hundreds.

Referring to FIG. 5C, the first pad portion PAD1 may be disposed at the second surface S2 of the substrate 100. In such an embodiment, the first pad portion PAD1 may include the plurality of first pad terminals PAD1-1 and PAD1-2.

Referring to FIG. 5C, the plurality of first pad terminals PAD1-1 and PAD1-2 may be extended in parallel along the third direction (Z-axis). The plurality of first pad terminals PAD1-1 and PAD1-2 may be spaced apart from each other along the first direction (X-axis). Two or more first pad terminals PAD1-1 and PAD1-2 may be disposed corresponding to one through hole H1. For example, two first pad terminals PAD1-1 and PAD1-2 and one through hole H1 may be arranged to overlap each other.

According to the present embodiment, two or more connection wirings CL1 and CL2 may be connected to two or more first pad terminals PAD1-1 and PAD1-2, respectively, through one through hole H1.

The first connection wiring CL1 is connected to one (1-1)-th pad terminal PAD1-1 through the through hole H1, and the second connection wiring CL2 is connected to another (1-2)-th pad terminal PAD1-2 through the same through hole H1. The first connection wiring CL1 and the second connection wiring CL2 are not connected to each other on the first surface S1 of the peripheral area PA and in the through hole H1. The (1-1)-th pad terminal PAD1-1 and the (1-2)-th pad terminal PAD1-2 are also insulated from each other. The detailed description of the through hole H1 and an insulator 120 will be described below.

The first connection wiring CL1 and the second connection wiring CL2 may be insulated by the insulator 120 that divides the through hole H1 inside the through hole H1. The insulator 120 may divide one through hole H1 into at least two spaces or areas H11 and H12. For convenience of explanation, a space or an area divided by the insulator 120 is referred to as a connection hole H11 or H12. The connection wiring CL1 may be connected to one (1-1)-th pad terminal PAD1-1 through a first connection hole H11, and the second connection wiring CL2 may be connected to another (1-2)-th connection pad PAD1-1 through a second connection hole H12.

Referring to FIGS. 5A-5C, the plurality of connection wirings CL may be electrically connected to the plurality of first pad terminals PAD1-1 and PAD1-2 through the plurality of connection holes H11 and H12, respectively. In such an embodiment, the plurality of connection holes H11 and H12 may be filled with a conductive material. According to the present embodiment, the conductive material located in the plurality of connection holes H11 and H12 may include a material substantially the same as a material included in the plurality of connection wiring lines CL. In addition, the plurality of first pad terminals PAD1-1 and PAD1-2 may include a material substantially the same as the material included in the plurality of connection wirings CL.

Hereinafter, the structure of the through hole and the insulator will be described in more detail with reference to FIGS. 6A-13D. The insulator 120 may have any suitable shape that divides the through hole H10 in a plan view.

Figure 6A:
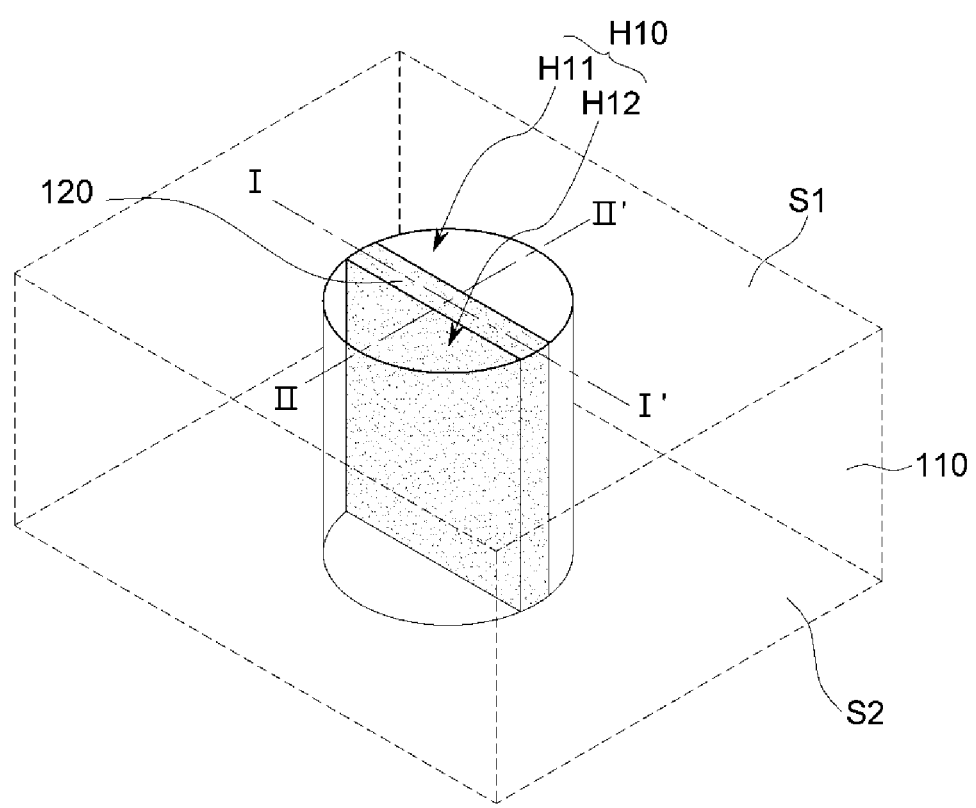
FIG. 6A is a perspective view illustrating a through hole and an insulator of a substrate according to an embodiment.
Figure 6B:
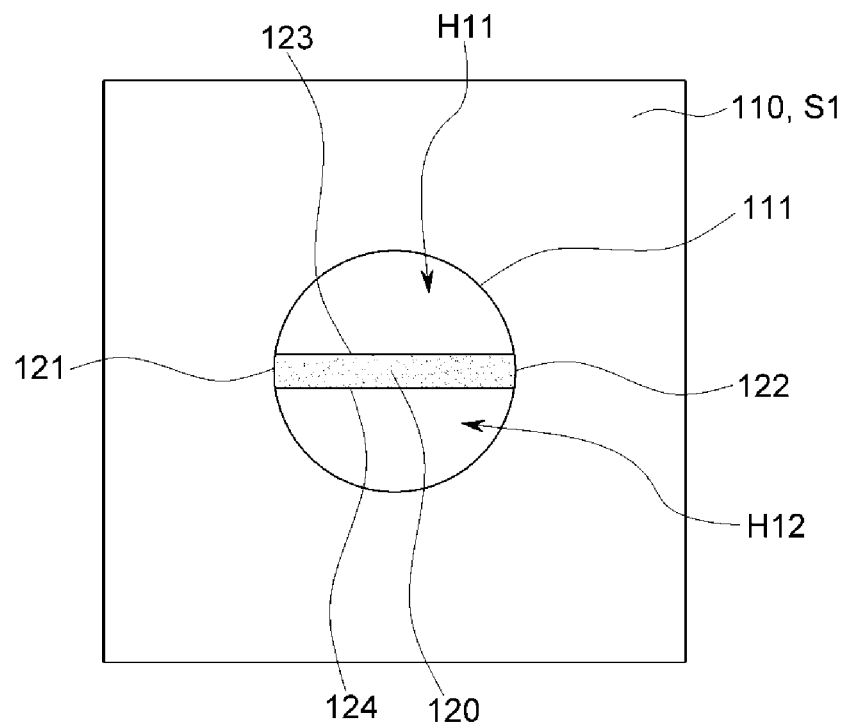
FIG. 6B is a plan view of FIG. 6A.
Figure 6C:
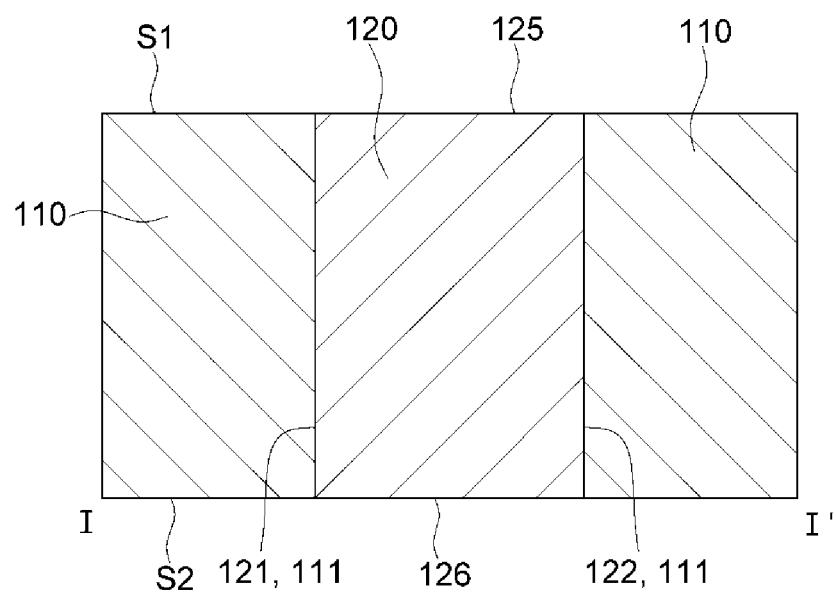
FIG. 6C is a cross-sectional view taken along the line I-I' of FIG. 6A.
Figure 6D:
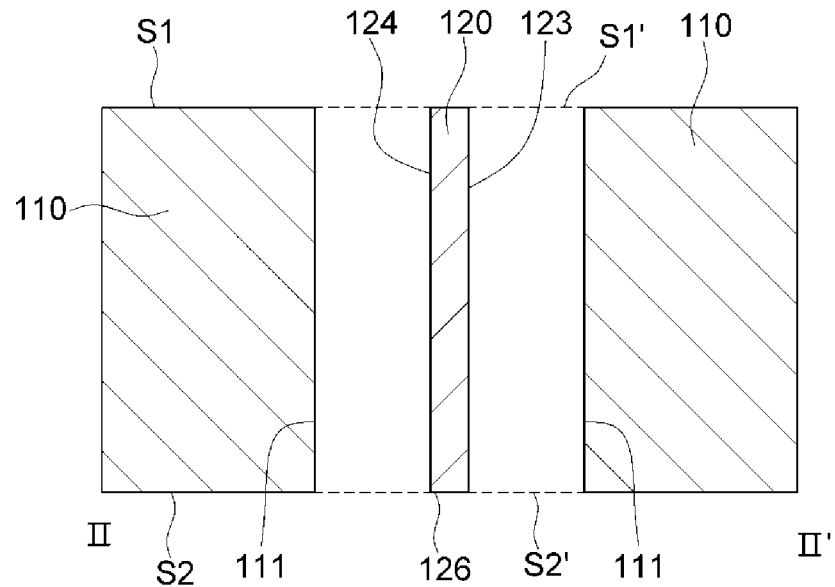
FIG. 6D is a cross-sectional view taken along the line II-II' of FIG. 6A.

FIG. 6A is a perspective view illustrating a through hole and an insulator of a substrate according to an embodiment, FIG. 6B is a plan view of FIG. 6A, FIG. 6C is a cross-sectional view taken along the line I-I' of FIG. 6A, and FIG. 6D is a cross-sectional view taken along the line II-II' of FIG. 6A.

Referring to FIGS. 6A-6D, the substrate 110 has the through hole H10 that is defined (e.g., formed) through the substrate 110.

The substrate 110 may include an insulating material. The substrate 110 may include an inorganic material such as glass and/or quartz, and/or may include an organic material such as polyimide. The substrate 110 may have a multi-layer structure in which two or more layers overlap. For example, the substrate 110 may include an insulating layer disposed on an upper surface and a lower surface of the substrate 110. The substrate 110 may be a rigid substrate or a flexible substrate.

Each of the through holes H10 defined by (e.g., formed on) the substrate 110 may be defined as a space or an area surrounded by an inner side surface of the substrate 110 between the first surface S1 and the second surface S2 of the substrate 110. In other words, one through hole H10 is a space or an area that is defined only by two imaginary planar surfaces S1' and S2' extending from the first surface S1 and the second surface S2 of the substrate 110, respectively, and an inner side surface 111 of the substrate 110. Accordingly, in a plan view, the through hole H10 is a space completely surrounded only by the inner side surface 111 of the substrate 110. As described above, the substrate 110 may have a multilayer structure in which a plurality of layers are stacked, and the inner side surface 111 of the substrate 110 may include a plurality of inner side surfaces 111 of the plurality of layers.

Referring to FIGS. 6A-6D, the through hole H10 has a cylindrical shape defined vertically through the substrate 110. As illustrated in FIG. 6B, the inner side surface 111 of the through hole H10 is a circle in a plan view, and as illustrated in FIGS. 6A and 6D, a cross sectional view of the inner side surface 111 of the through hole H10 may be a straight line perpendicular to the surface S1 and the second surface S2. For example, a diameter or breadth of the through hole H10, that is, a diameter or breadth of the circular opening in a plan view, may be in a range from about 10 μm to about 1000 μm. For example, a height of the through hole H10, that is, a thickness of the substrate 110 may be in a range from about 0.1 mm to about 1 mm. The through holes H10 may have substantially the same diameter or breadth at all heights (e.g., a uniform diameter or breadth throughout the thickness direction).

Referring to FIGS. 6A-6D, the insulator 120 divides the through hole H10 into two connection holes H11 and H12.

The insulator 120 may include any suitable insulating material. The insulator 120 may include an inorganic material such as glass and/or quartz, and/or may include an organic material such as polyimide. The insulator 120 may include a material different from a material included in the substrate 110.

The insulator 120 may be in the form of a flat plate.

The insulator 120 may include a first portion that extends in the first direction from a center of the through hole H10 in a plan view and contacts (e.g., one side of) the inner side surface 111 of the substrate 110, and a second portion that extends in a second direction that is opposite to the first direction from the center of the through hole H10 in a plan view and contacts (e.g., another side of) the inner side surface 111 of the substrate 110.

For example, as illustrated in FIG. 6B, the insulator 120 includes a first side surface 121, a second side surface 122, a third side surface 123 and a fourth side surface 124 in a plan view. The first and second side surfaces 121 and 122 face (e.g., face oppositely away from) each other, and the third and fourth side surfaces 123 and 124 face (e.g., face oppositely away from) each other. The first side surface 121 contacts the third and fourth side surfaces 123 and 124, and the second side surface 122 contacts the third and fourth side surfaces 123 and 124.

As illustrated in FIGS. 6C and 6D, the insulator 120 includes an upper surface 125 and a lower surface 126 that contact the first side surface 121, the second side surface 122, the third side surface 123 and the fourth side surface 124 in a cross-sectional view. The upper surface 125 and the lower surface 126 may be coplanar with the first surface S1 and the second surface S2, respectively. A height of the insulator 120, that is, a distance between the upper surface 125 and the lower surface 126, may be substantially equal to a thickness of the substrate 110.

As illustrated in FIGS. 6B and 6C, the entire first and second side surfaces 121 and 122 of the insulator 120 may contact the inner side surface 111 of the substrate 110 in a plan view and a cross-sectional view. The first and second side surfaces 121 and 122 may have substantially the same shape as the shape of the inner side surface 111 of the substrate 110. That is, the first and second side surfaces 121 and 122 may have substantially the same shape as the shape of the portion of the inner side surface 111 of the substrate 110 they are in contact with. For example, the first and second side surfaces 121 and 122 may have a curvature substantially the same as a curvature of the inner side surface 111 of the substrate 110. A distance between the first and second side surfaces 121 and 122, that is, a width of the insulator 120, is substantially equal to a diameter or breadth of the through hole H10.

However, embodiments of the present disclosure are not limited thereto, and an adhesive layer may be disposed between each of the first and second side surfaces 121 and 122 and the inner side surface 111. In addition, the first and second side surfaces 121 and 122 may have a shape different from the shape of the inner side surface 111 of the substrate 110. For example, the first and second side surfaces 121 and 122 may be planar surfaces.

As illustrated in FIGS. 6B and 6D, the third and fourth side surfaces 123 and 124 of the insulator 120 may be planar surfaces that are parallel to each other in a plan view and a cross-sectional view. The third and fourth side surfaces 123 and 124 face the inner side surface 111 of the substrate 110. Edges of the third and fourth side surfaces 123 and 124 contacting the first and second side surfaces 121 and 122 may contact the inner side surface 111 of the substrate 110. A distance between the third and fourth side surfaces 123 and 124, that is, a thickness of the insulator 120, is less than the diameter or breadth of the through hole H10.

An imaginary planar surface that passes through the center of the through hole H10 and is perpendicular to the first surface S1 and the second surface S2 may be defined between the third and fourth side surfaces 123 and 124. The vertical imaginary planar surface may be perpendicular to a direction (X-axis direction in FIG. 5A) in which the plurality of connection wirings CL1 and CL2 are spaced apart from each other. Accordingly, the width direction of the insulator 120 in a plan view is perpendicular to the direction (X-axis direction in FIG. 5A) in which the plurality of connection wirings CL1 and CL2 are spaced apart from each other, and parallel to the direction (Y-axis direction in FIG. 5A) in which the plurality of connection wirings CL1 and CL2 extend.

Each of the third and fourth side surfaces 123 and 124 and the inner side surface 111 of the substrate 100 define the first and second connection holes H11 and H12 that are separated from each other. The first connection hole H11 is defined as a space surrounded by the inner side surface 111 of the substrate 100 and the third side surface 123 in a plan view, and the second connection hole H12 is defined as a space surrounded by the inner side surface 111 of the substrate 100 and the fourth side surface 124. The first and second connection holes H11 and H12 may be spaced apart from each other in a direction (X-axis direction in FIG. 5A) in which the plurality of connection wirings CL1 and CL2 are spaced apart from each other.

Accordingly, the through hole H10 may be partitioned into two connection holes H11 and H12 by the insulator 120, and the connection wirings CL1 and CL2 disposed at the first surface S1 may be connected to the first pad portion PAD1 disposed at the second surface S2 through the connection holes H11 and H12, respectively.

The diameter or breadth of the through hole H10 and the distance between the through holes H10 may be greater than a line width of the connection line CL and a distance between the connection lines CL. Accordingly, a resolution of the connection wirings CL, i.e., the number of connection wirings CL that may be disposed apart from each other within a certain distance, may be limited by the number of through holes H10. According to an embodiment, by dividing the through hole H10 into two connection holes H11 and H12 separated from each other, the number of the connection wirings CL that can be connected through the same number of through holes H10 may be doubled, and accordingly, the resolution of the connection wirings CL may be increased.

Figure 7A:
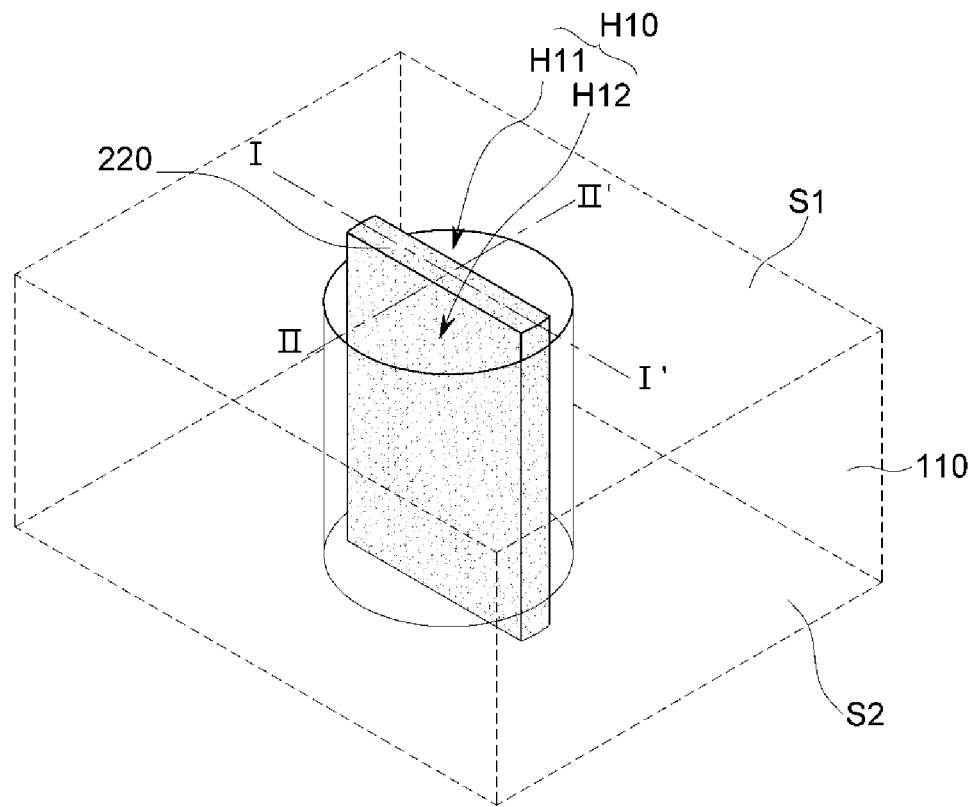
FIG. 7A is a perspective view illustrating a through hole and an insulator of a substrate according to a modified embodiment.
Figure 7B:
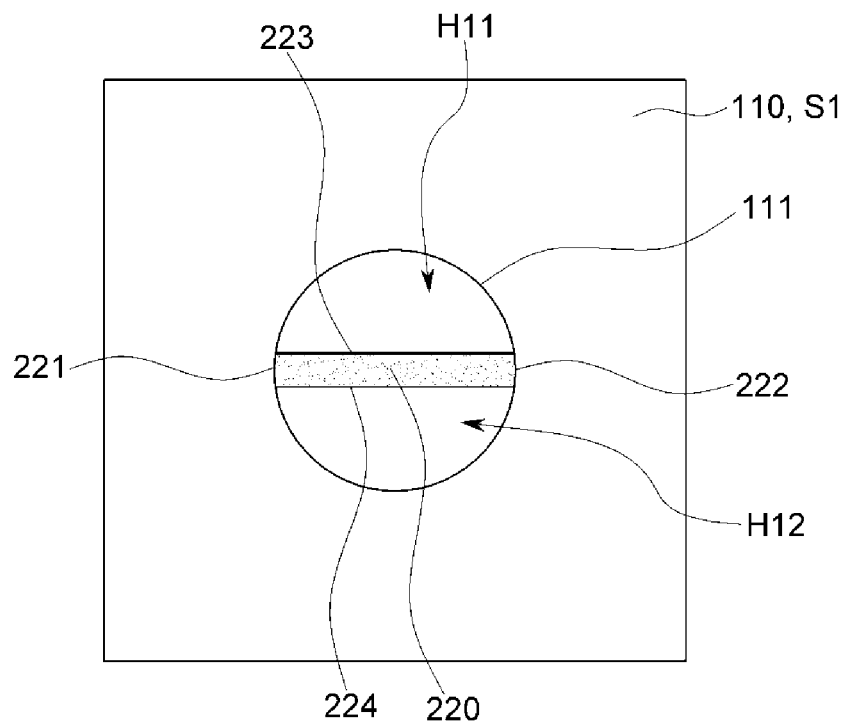
FIG. 7B is a plan view of FIG. 7A.
Figure 7C:
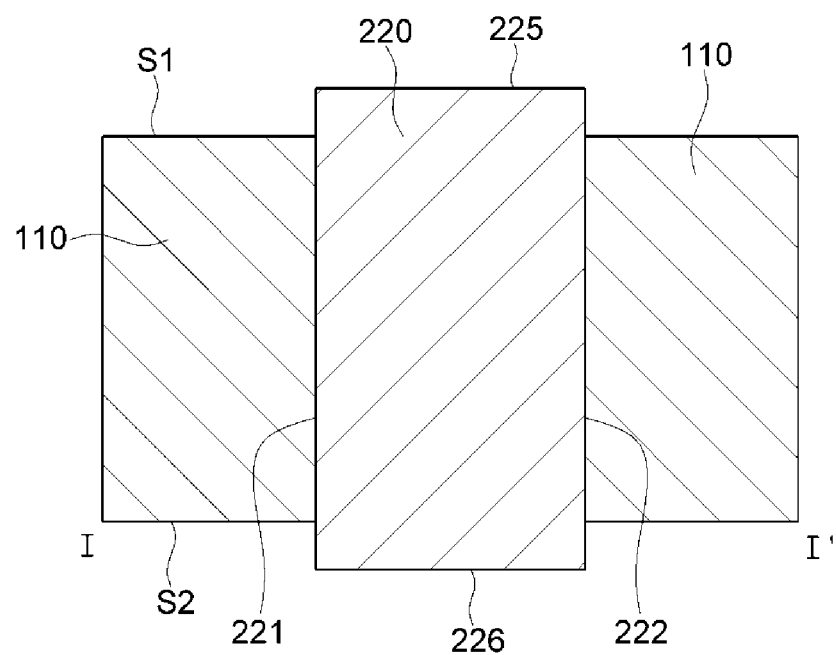
FIG. 7C is a cross-sectional view taken along the line I-I' of FIG. 7A.
Figure 7D:
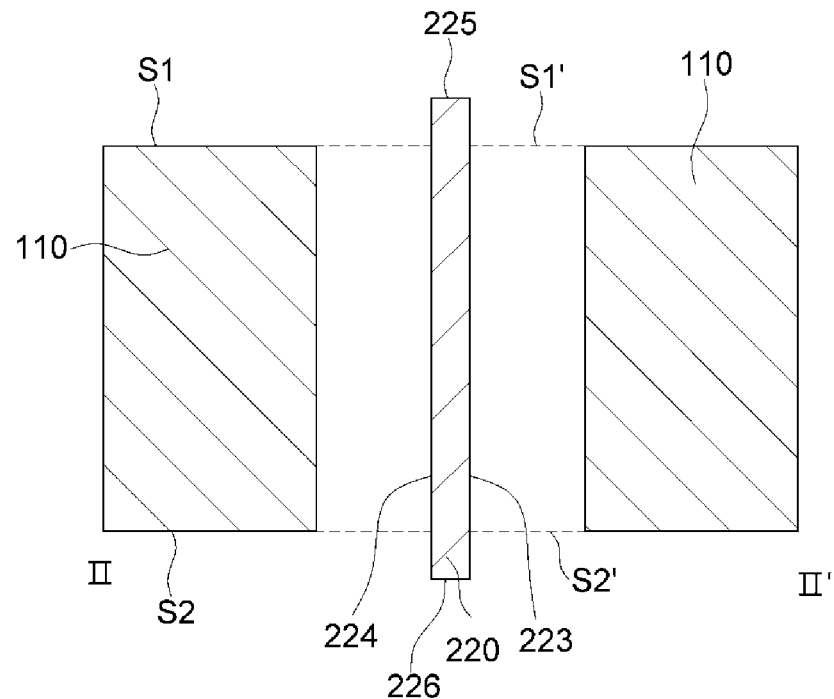
FIG. 7D is a cross-sectional view taken along the line II-II' of FIG. 7A.

FIG. 7A is a perspective view illustrating a through hole and an insulator of a substrate according to a modified embodiment, FIG. 7B is a plan view of FIG. 7A, FIG. 7C is a cross-sectional view taken along the line I-I' of FIG. 7A, and FIG. 7D is a cross-sectional view taken along the line II-II' of FIG. 7A.

The present embodiment includes the substrate 110, the through hole H10, and the connection holes H11 and H12 described with reference to FIGS. 6A-6D, and a description thereof will not be repeated.

Referring to FIGS. 7A-7D, a height of an insulator 220 according to the present embodiment is greater than a thickness of the substrate 110.

As illustrated in FIG. 7B, the insulator 220 includes a first side surface 221, a second side surface 222, a third side surface 223 and a fourth side surface 224 in a plan view. As illustrated in FIGS. 7C and 7D, the insulator 220 includes an upper surface 225 and a lower surface 226 that contact the first side surface 221, the second side surface 222, the third side surface 223 and the fourth side surface 224 in a cross-sectional view. The upper surface 225 is higher than the first surface S1, and the lower surface 226 is lower than the second surface S2. A height of the insulator 220, that is, a distance between the upper surface 225 and the lower surface 226, is greater than the thickness of the substrate 110.

As illustrated in FIGS. 7B and 7C, portions of the first and second surfaces 221 and 222 of the insulator 220 between the first surface S1 and the second surface S2 contact the inner side surface 111 of the substrate 110, and remaining portions thereof protrude from the first surface S1 and the second surface S2 of the substrate 110. Similarly, portions of the third and fourth side surfaces 223 and 224 of the insulator 220 protrude from the first surface S1 and the second surface S2 of the substrate 110.

The insulator 220 according to the present embodiment protrudes from the first surface S1 and the second surface S2 of the substrate 100. Accordingly, the possibility that a metal filled in the connection holes H11 and H12 are connected to each other on the upper surface 225 or the lower surface 226 of the insulator 220 may be reduced.

Figure 8A:
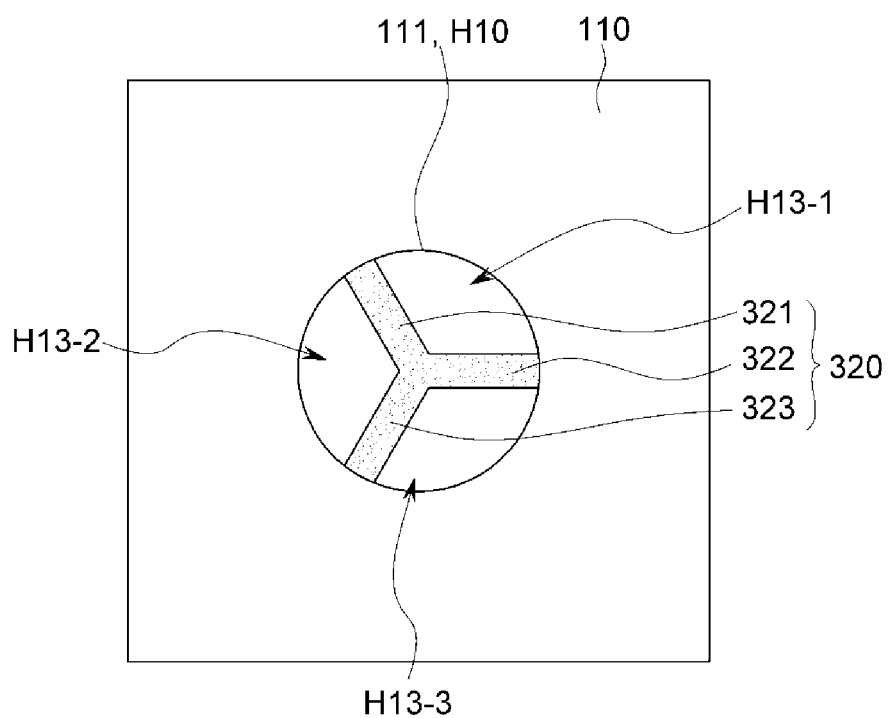
FIGS. 8A and 8B are plan views illustrating through holes and insulators of substrates according to modified embodiments.
Figure 8B:
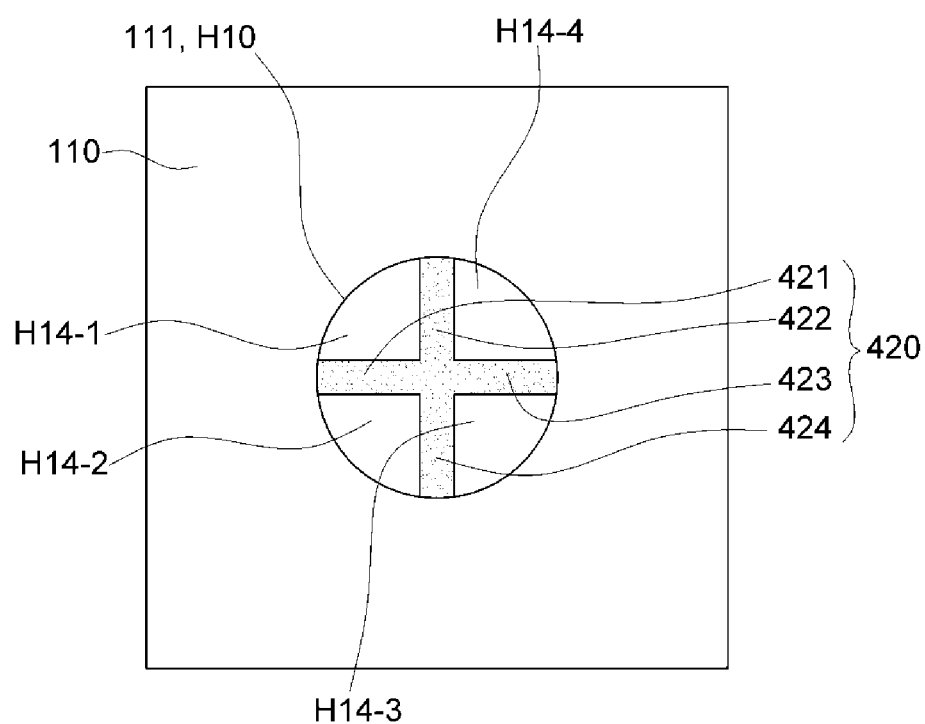

FIGS. 8A and 8B are plan views illustrating through holes and insulators of substrates according to modified embodiments.

Referring to FIG. 8A, an insulator 320 according to the present embodiment divides the through hole H10 into three connection holes H13-1, H13-2, and H13-3.

The insulator 320 includes, in a plan view, a first portion 321 that extends in the first direction from a center of the through hole H10 and contacts the inner side surface 111 of the substrate 110, a second portion 322 that extends in the second direction that intersects (e.g., crosses) the first direction from the center of the through hole H10 and contacts the inner side surface 111 of the substrate 110, and a third portion 323 that extends in the third direction that intersects (e.g., crosses) the first direction and the second direction from the center of the through hole H10 and contacts the inner side surface 111 of the substrate 110. Angles between the first, second and third directions may all be equal to 120 degrees.

The first, second, and third portions 321, 322, and 323 contact each other at a straight line (hereinafter, a center line of the through hole H10) that passes through the center of the through hole H10 and crosses (e.g., is perpendicular to) the first surface S1 and the second surface S2. Each of side surfaces of the first, second and third portions 321, 322 and 323 opposite to the center line contact the inner side surface 111 of the substrate 110.

Referring to FIG. 8B, an insulator 420 according to an embodiment divides the through hole H10 into four connection holes H14-1, H14-2, H14-3, and H14-4.

The insulator 420 includes, in a plan view, a first portion 421 that extends in the first direction from a center of the through hole H10 and contacts the inner side surface 111 of the substrate 110, a second portion 422 that extends in the second direction that intersects (e.g., crosses) the first direction from the center of the through hole H10 and contacts the inner side surface 111 of the substrate 110, a third portion 423 that extends in the third direction that intersects (e.g., crosses) the first direction and the second direction from the center of the through hole H10 and contacts the inner side surface 111 of the substrate 110, and a fourth portion 424 that extends in a fourth direction that is opposite to the second direction from the center of the through hole H10 and contacts the inner side surface 111 of the substrate 110. Angles between the first, second, third and fourth directions may all be equal to 90 degrees.

The insulator 420 may include five or more portions extending in different directions from the center of the through hole H10 and contacts the inner side surface 111 of the substrate 100.

Figure 9A:
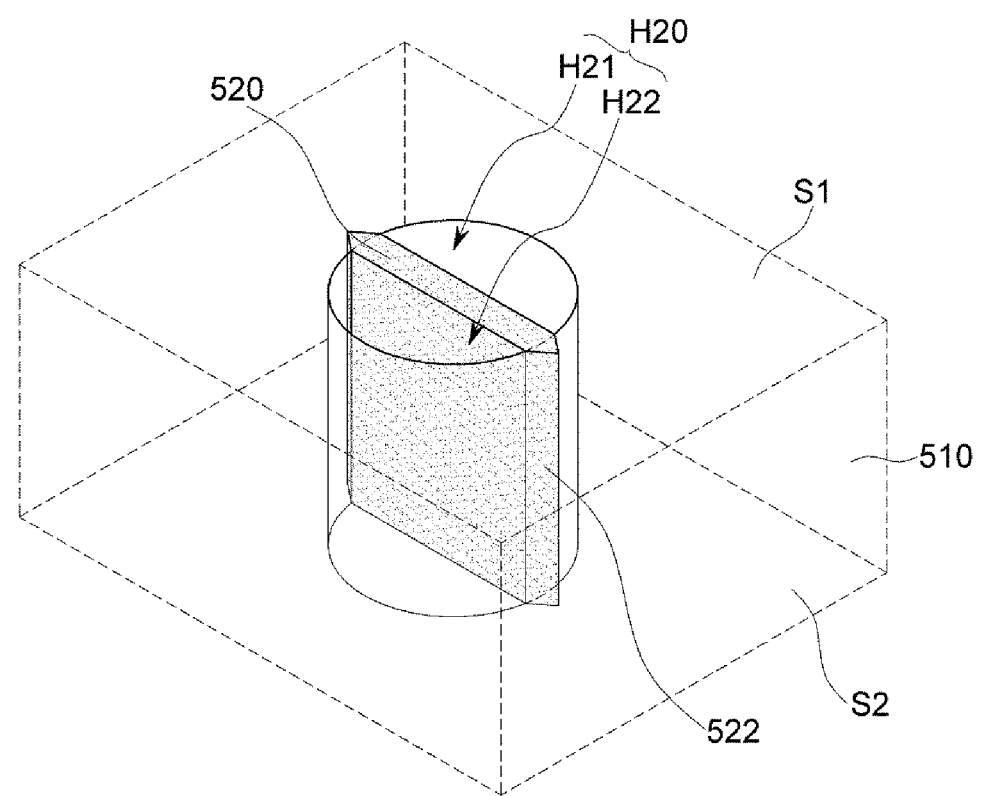
FIG. 9A is a perspective view illustrating a through hole and an insulator of a substrate according to a modified embodiment.
Figure 9B:
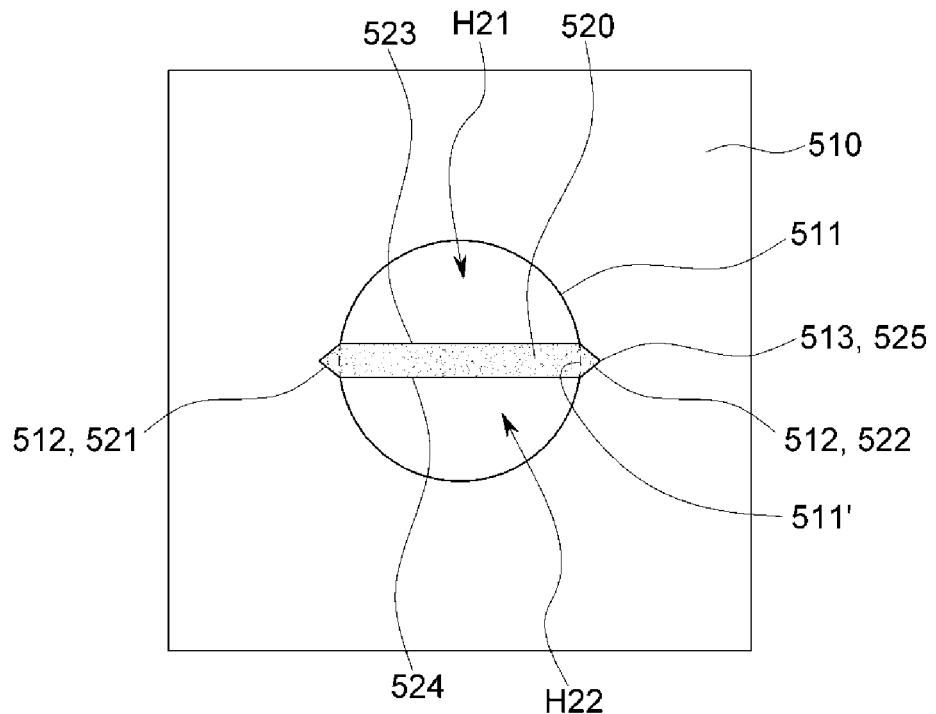
FIG. 9B is a plan view of FIG. 9A.

FIG. 9A is a perspective view illustrating a through hole and an insulator of a substrate according to a modified embodiment, and FIG. 9B is a plan view of FIG. 9A.

First and second side surfaces 521 and 522 of an insulator 520 according to the present embodiment include a protruding portion 525 that protrudes toward a substrate 510 in a plan view.

The first and second side surfaces 521 and 522 of the insulator 520 contact an inner side surface 511 of the substrate 510. Third and fourth side surfaces 523 and 524 of the insulator 520 define first and second connection holes H21 and H22 together with the inner side surface 511 of the substrate 510.

The first and second side surfaces 521 and 522 include the protruding portions 525 extending in a direction perpendicular to the first surface S1 and the second surface S2. The protruding portion 525 is farther away from the center line than an imaginary surface 511' that extends from the inner side surface 511 of the substrate 510 that does not contact the insulator 520. Accordingly, a distance from the center line to the protruding portion 525 of the first and second side surfaces 521 and 522 is greater than a radius or half-breadth of the inner side surface 511 of the substrate 510 that does not contact the insulator 520.

A through hole H20 is defined in a cylindrical shape as the shape of the through hole H10 in FIGS. 6A-6D, and the insulator 520 that includes the protruding portion 525 may be inserted thereinto. Due to elasticity of the substrate 510, the inner side surface 511 of the through hole H20 may be defined with (e.g., form) a depressed portion corresponding to the protruding portion 525. Alternatively, the inner side surface 511 and 511' in a cylindrical shape is formed at the substrate 510, and a depressed portion 512 corresponding to the protruding portion 525 may be defined (e.g., formed) in advance at the inner side surface 511' to be disposed with the protruding portion 525. The protruding portion 525 of the insulator 520 may be inserted into the depressed portion 512.

According to the present embodiment, the insulator 520 that has a width wider than a diameter or breadth of the through hole H20 may be easily inserted into the through hole H20, and the possibility that a gap may be generated between the inner side surface 511 of the substrate 510 and the insulator 520 may be reduced. The shape of the side surface 522 of the insulator 520 according to an embodiment may be applied to a side surface of an insulator that contacts the inner side surface of the substrate 100 in all of the embodiments described herein.

Figure 10:
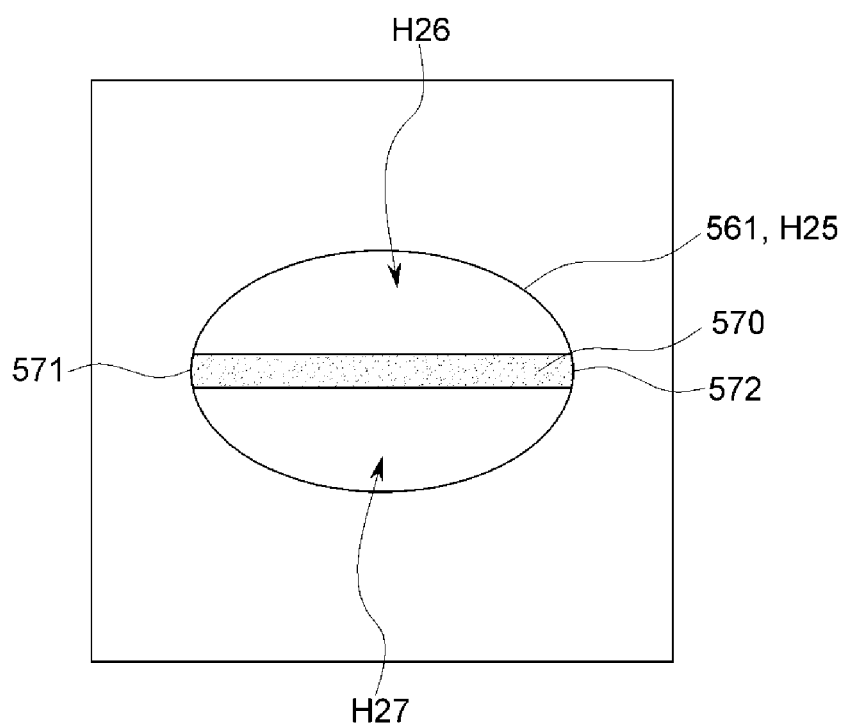
FIG. 10 is a plan view illustrating a through hole and an insulator of a substrate according to a modified embodiment.

FIG. 10 is a plan view illustrating a through hole and an insulator of a substrate according to a modified embodiment.

According to the present embodiment, in a plan view, a through hole H25 has a shape in which a diameter or breadth varies according to the direction (e.g., along different directions), for example, the shape of an ellipse. The through hole H25 has a greatest diameter or breadth in a major axis direction.

Referring to FIG. 10, an insulator 570 divides the through hole H25 into two connection holes H26 and H27. The insulator 570 may be in the form of a flat plate.

As illustrated in FIG. 10, the insulator 570 extends in a major axis direction from a center line of the through hole H25, and contacts an inner side surface 561 of a substrate. The insulator 570 includes a first side surface 571 and a second side surface 572 that contact the inner side surface 561 of the substrate in a plan view. A distance between the first and second side surfaces 571 and 572, that is, a width of the insulator 570, may correspond to a diameter or breadth of the through hole H25 in the major axis direction.

Although the ellipse is exemplarily described according to the present embodiment, the through hole H25 may have any suitable shape, e.g., the shape of a polygon such as a quadrangle having different diameters or breadths along the direction (e.g., along different directions) in a plan view, and the insulator 570 may have a width that corresponds to the greatest diameter or breadth thereof.

According to the present embodiment, the insulator 570 may not be rotated in the through hole H25, and thus its position may be fixed along the major axis of the through hole H25.

Figure 11A:
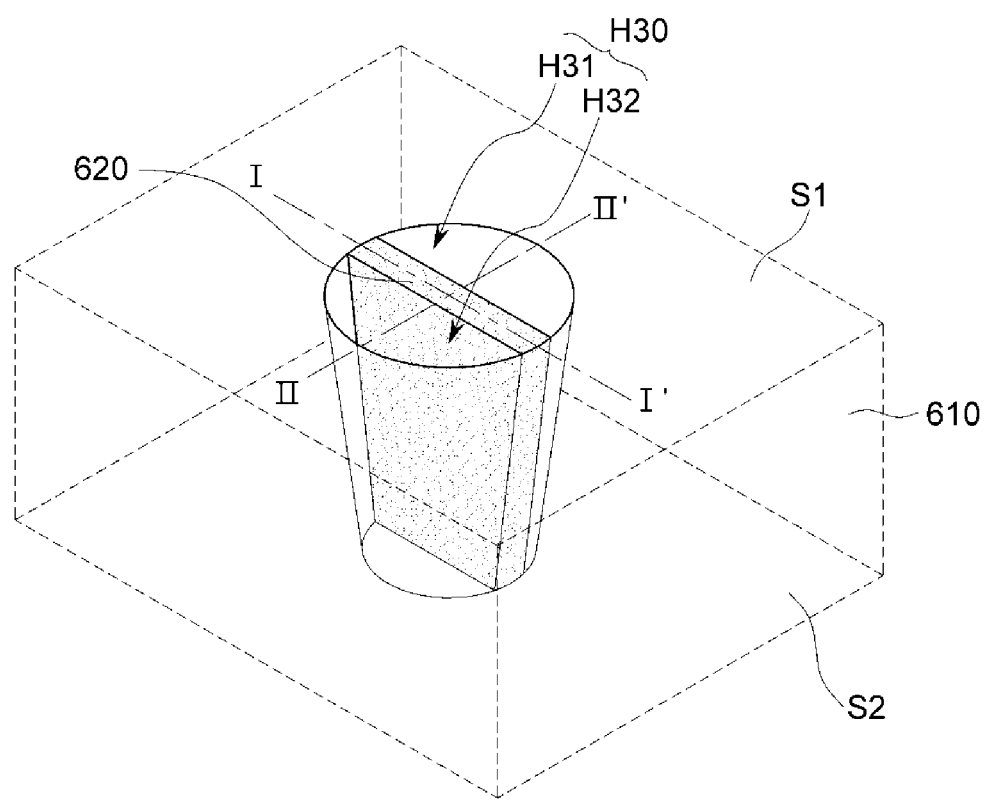
FIG. 11A is a perspective view illustrating a through hole and an insulator of a substrate according to a modified embodiment.
Figure 11B:
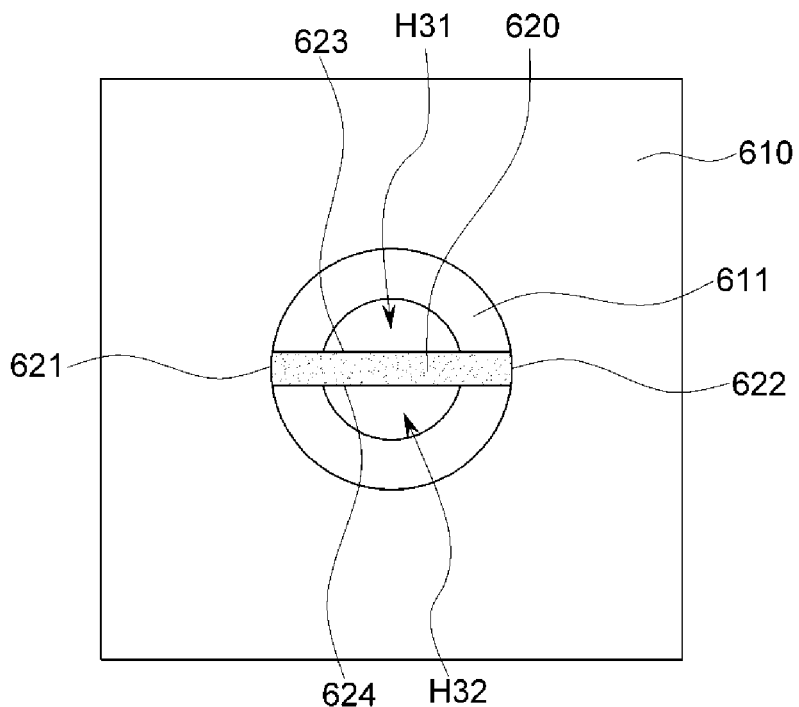
FIG. 11B is a plan view of FIG. 11A.
Figure 11C:
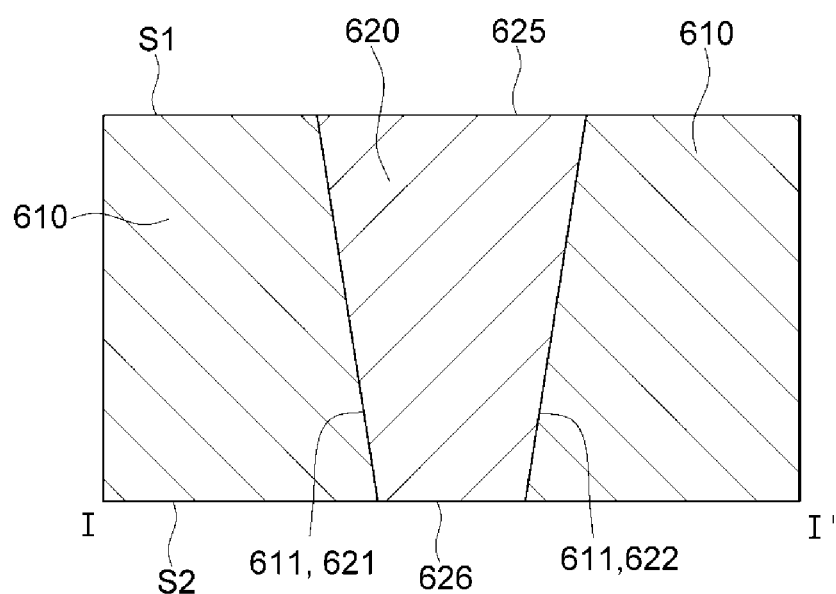
FIG. 11C is a cross-sectional view taken along the line I-I' of FIG. 11A.
Figure 11D:
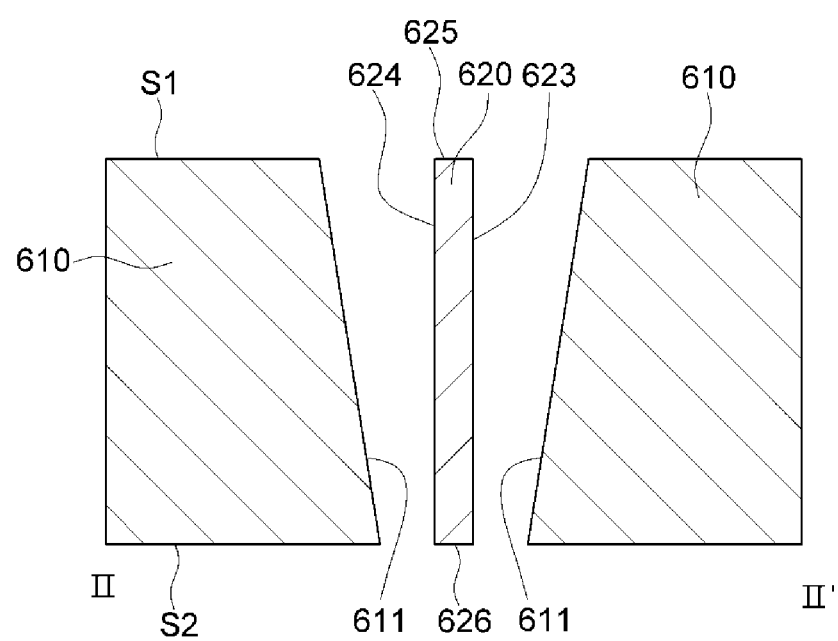
FIG. 11D is a cross-sectional view taken along the line II-II' of FIG. 11A.

FIG. 11A is a perspective view illustrating a through hole and an insulator of a substrate according to a modified embodiment, FIG. 11B is a plan view of FIG. 11A, FIG. 11C is a cross-sectional view taken along the line I-I' of FIG. 11A, and FIG. 11D is a cross-sectional view taken along the line II-II' of FIG. 11A.

A through hole H30 according to an embodiment has a less (e.g., smaller) diameter or breadth as a distance from the first surface S1 or the second surface S2 increases. Hereinafter, the through hole H30 having a greater diameter or breadth on the first surface S1 will be described as an example.

Referring to FIGS. 11A-11D, the through hole H30 is in the shape of a circular cone passing through a substrate 610. As illustrated in FIG. 11B, an inner side surface 611 of the through hole H30 is circular in a plan view, and as illustrated in FIGS. 11C and 11D, the inner side surface 611 of the through hole H30 may be an inclined straight line intersecting the first surface S1 and the second surface S2 in a cross-sectional view. The through hole H30 may have any suitable curved line shape in which the diameter or breadth decreases from the first surface S1 toward the second surface S2 in a cross-sectional view.

Referring to FIGS. 11A-11D, the insulator 620 divides the through hole H30 into two connection holes H31 and H32. The insulator 620 may be in the form of a flat plate.

The insulator 620 includes a first side surface 621, a second side surface 622, a third side surface 623, a fourth side surface 624, an upper surface 625 and a lower surface 626. As illustrated in FIGS. 11B and 11C, the first and second surfaces 621 and 622 of the insulator 620 that face (e.g., face oppositely away from) each other may contact the inner side surface 611 of the substrate 610. A distance between the first and second surfaces 621 and 622, that is, a width of the insulator 620 is substantially equal to a diameter or breadth of the through hole H30. Accordingly, the distance between the first and second surfaces 621 and 622 decreases from the upper surface 625 toward the lower surface 626.

According to the present embodiment, the insulator 620 may be easily inserted into the through hole H30, and the insulator 620 may be stably fixed. In addition, even if the diameters or breadths of the through holes H30 (e.g., the diameters or breadths of the through hole H30 from top to bottom) are different (e.g., slightly different) from each other, the insulator 620 may be brought into close contact with the inner side surface 611 of the substrate 610.

The through hole H30 is not limited to a circular shape in a plan view, but may have an elliptical shape of FIG. 10. In addition, the insulator 620 may have shapes as illustrated in FIGS. 8A, 8B, 9A and 9B in a plan view.

Figure 12A:
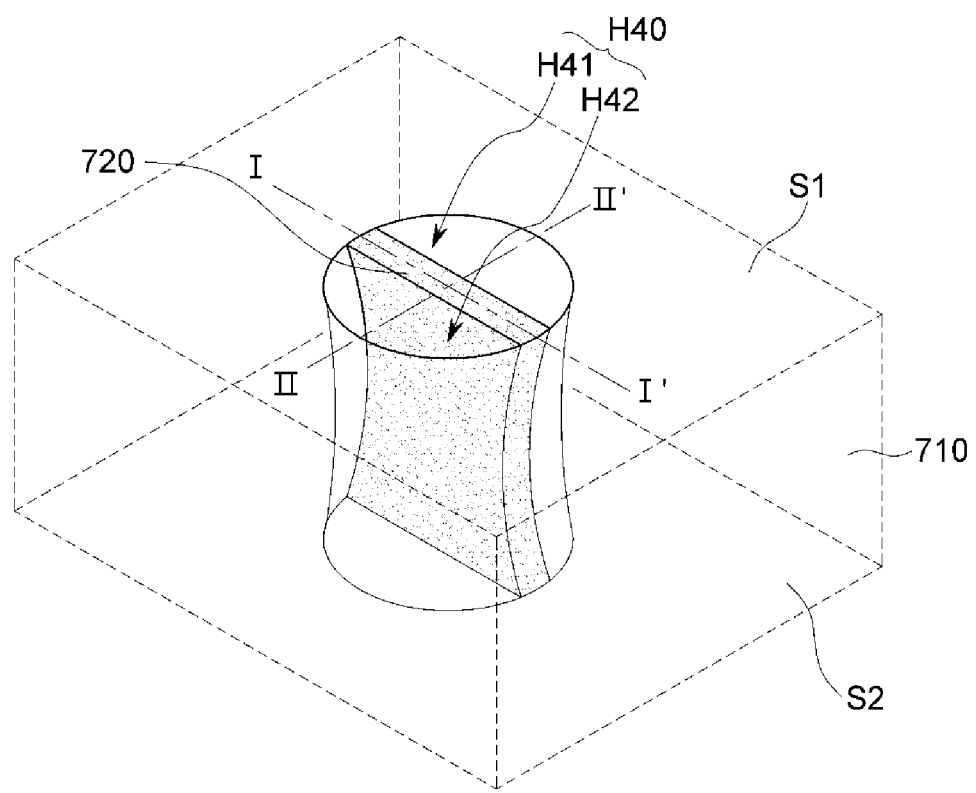
FIG. 12A is a perspective view illustrating a through hole and an insulator of a substrate according to a modified embodiment.
Figure 12B:
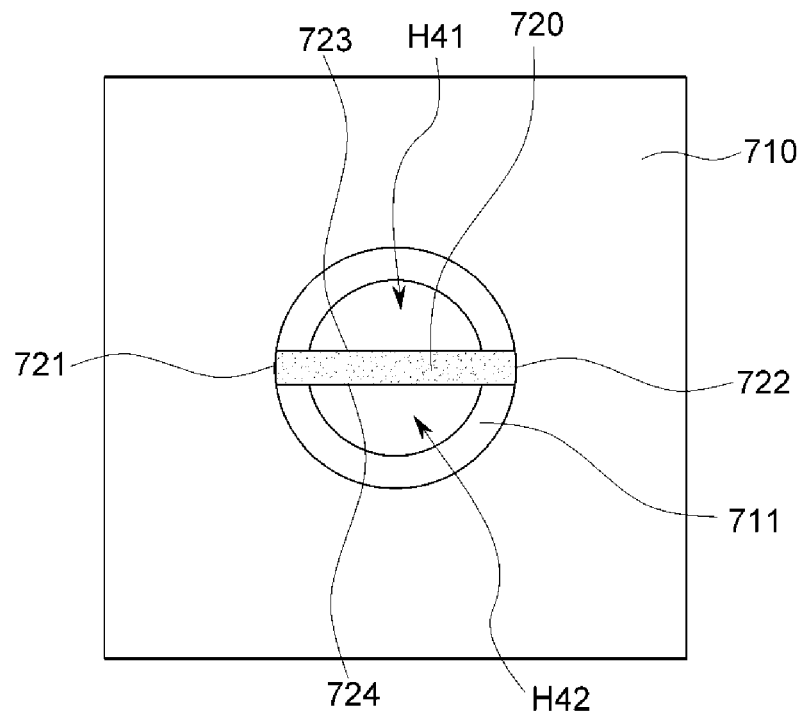
FIG. 12B is a plan view of FIG. 12A.
Figure 12C:
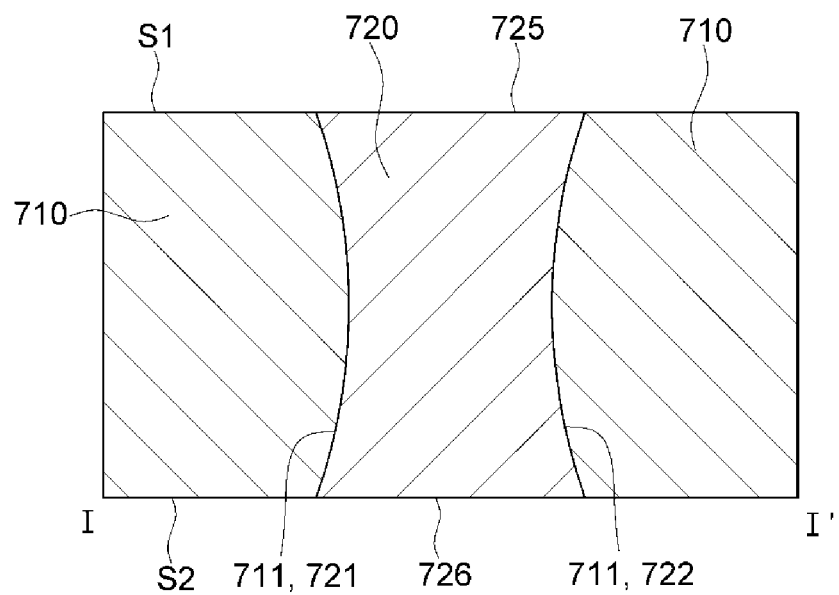
FIG. 12C is a cross-sectional view taken along the line I-I' of FIG. 12A.
Figure 12D:
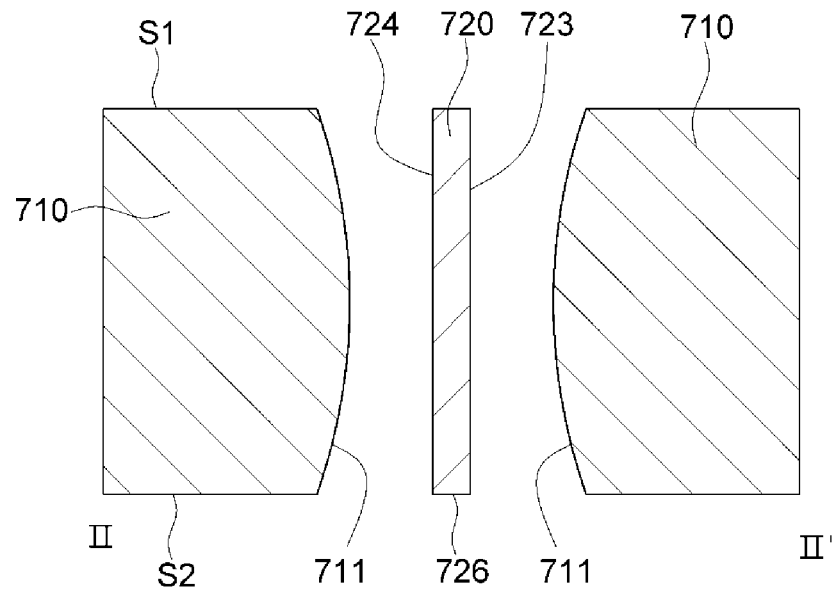
FIG. 12D is a cross-sectional view taken along the line II-II' of FIG. 12A.
Figure 13:
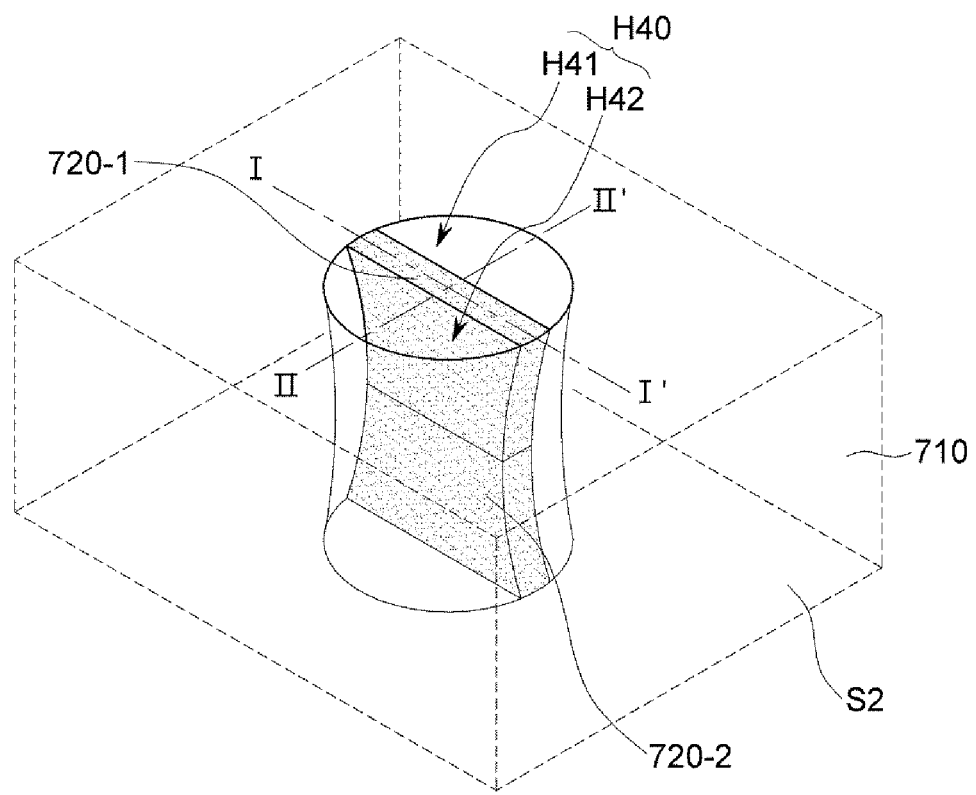
FIG. 13 is a perspective view illustrating an insulator of a substrate according to an embodiment.

FIG. 12A is a perspective view illustrating a through hole and an insulator of a substrate according to a modified embodiment; FIG. 12B is a plan view of FIG. 12A; FIG. 12C is a cross-sectional view taken along the line I-I' of FIG. 12A; FIG. 12D is a cross-sectional view taken along the line II-II' of FIG. 12A; FIG. 13 is a perspective view illustrating an insulator of a substrate according to an embodiment;

A through hole H40 according to the present embodiment has a smallest diameter or breadth between the first surface S1 or the second surface S2. The diameters or breadths of the through hole H40 on the first surface S1 and the second surface S2 may be substantially equal to or different from each other.

Referring to FIGS. 12A-12D, the through hole H40 has a bottleneck shape that passes through a substrate 710. As illustrated in FIG. 12B, an inner side surface 711 of the through hole H40 is circular in a plan view, and as illustrated in FIGS. 12C and 12D, the inner side surface 711 of the through hole H40 may be a curved line that is convex toward a center line between the first surface S1 and the second surface S2 in a cross-sectional view. The through hole H40 may have a curved line shape in which a diameter or breadth decreases and then increases again from the first surface S1 toward the second surface S2 in a cross-sectional view.

Referring to FIGS. 12A-12D, the insulator 720 divides the through hole H40 into two connection holes H41 and H42. The insulator 720 may be in a flat plate shape.

The insulator 720 includes a first side surface 721, a second side surface 722, a third side surface 723, a fourth side surface 724, an upper surface 725 and a lower surface 726. As illustrated in FIGS. 12B and 12C, the first and second surfaces 721 and 722 of the insulator 720 that face (e.g., face oppositely away from) each other may contact the inner side surface 711 of the substrate 710. A distance between the first and second surfaces 721 and 722, that is, a width of the insulator 720, is substantially equal to the diameter or breadth of the through hole H40. Accordingly, the distance between the first and second surfaces 721 and 722 decreases and then increases again from the upper surface 725 toward the lower surface 726. The width of the insulator 720 is the smallest at a center (e.g., midpoint) between the upper surface 725 and the lower surface 726.

The through hole H40 is not limited to a circular shape in a plan view, but may have an elliptical shape of FIG. 10. In addition, the insulator 720 may have shapes as illustrated in FIGS. 8A, 8B, 9A and 9B in a plan view.

According to the present embodiment, the insulator 720 is formed to have a straight side surface in a cross-section, similar to the insulator 120 illustrated in FIGS. 6A-6D, and when inserted into the through hole H40, the insulator 720 may be transformed according to the shape of the through hole H40.

Alternatively, as illustrated in FIG. 13, the insulator 720 may include a first insulator 720-1 and a second insulator 720-2. A width of the first insulator 720-1 decreases as a distance from the first surface S1 increases. A width of the second insulator 720-2 decreases as a distance from the second surface S2 increases. The first insulator 720-1 and the second insulator 720-2 contact each other between the first surface S1 and the second surface S2. A width at a surface where the first insulator 720-1 and the second insulator 720-2 contact each other may correspond to a smallest diameter or breadth of the through hole H40. The first insulator 720-1 may be inserted from the side of the first surface S1 and the second insulator 720-2 may be inserted from the side of the second surface S2.

Figure 14A:
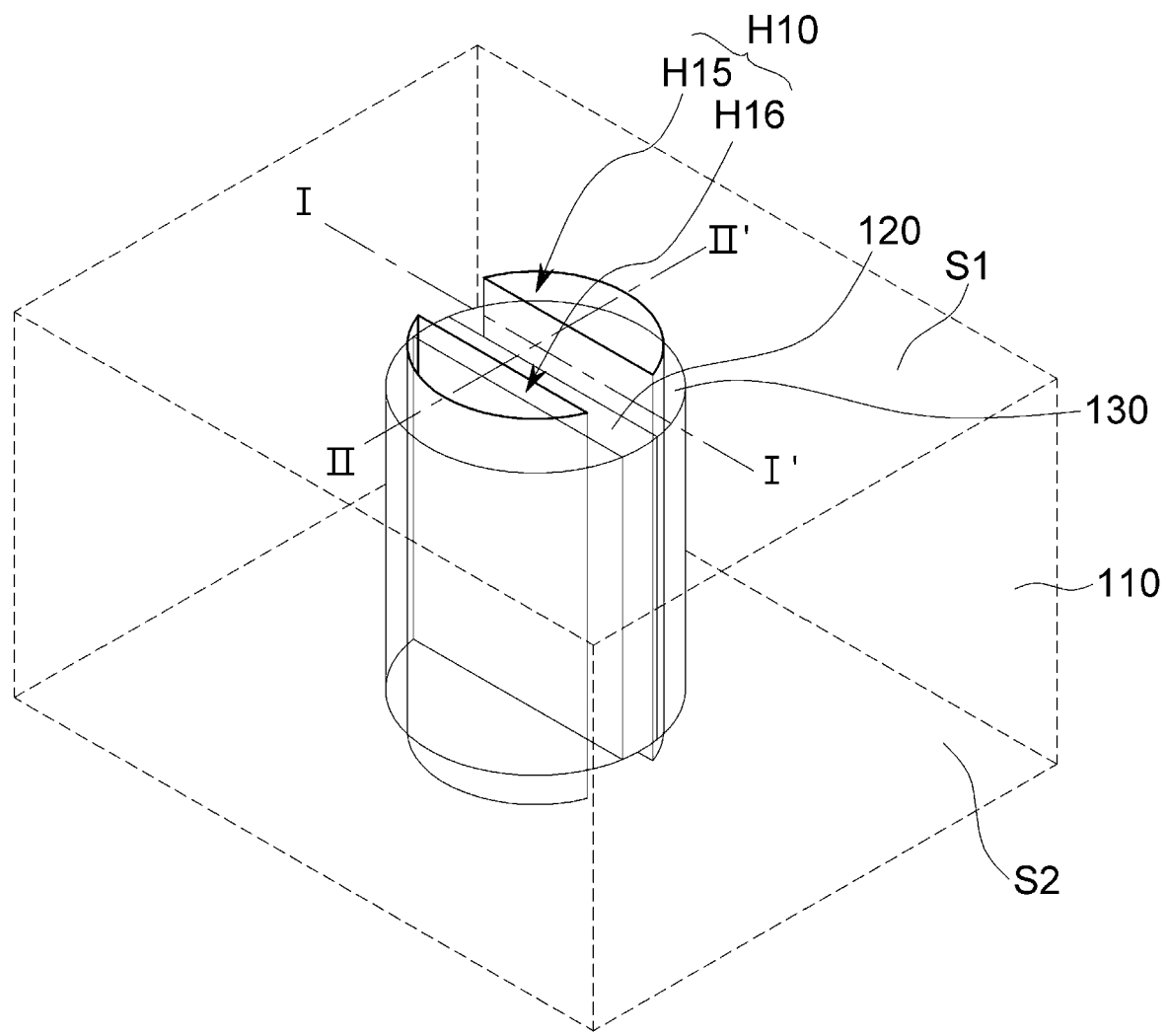
FIG. 14A is a perspective view illustrating a through hole and an insulator of a substrate according to a modified embodiment.
Figure 14B:
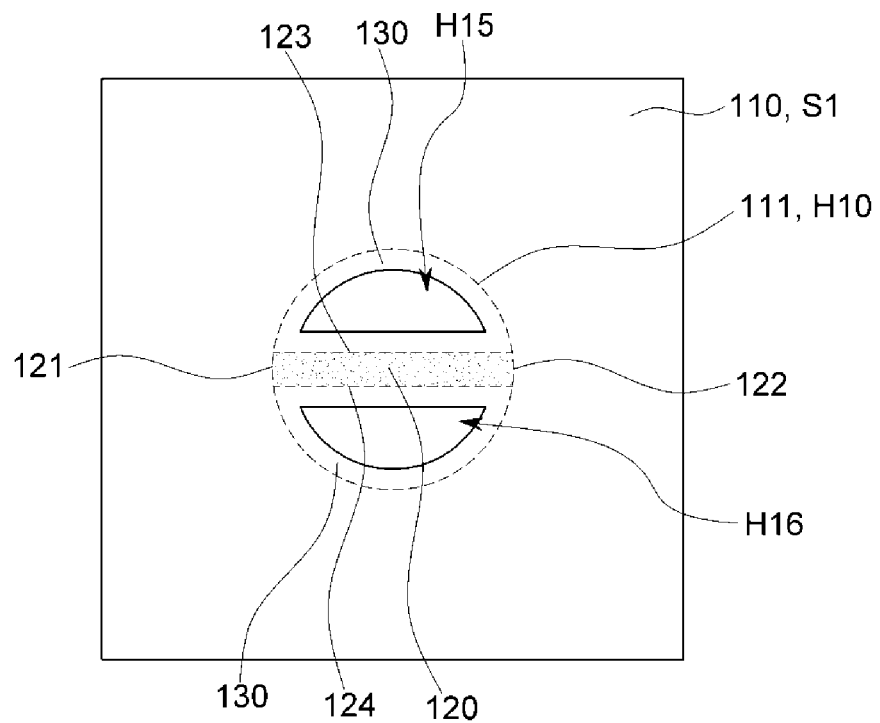
FIG. 14B is a plan view of FIG. 14A.
Figure 14C:
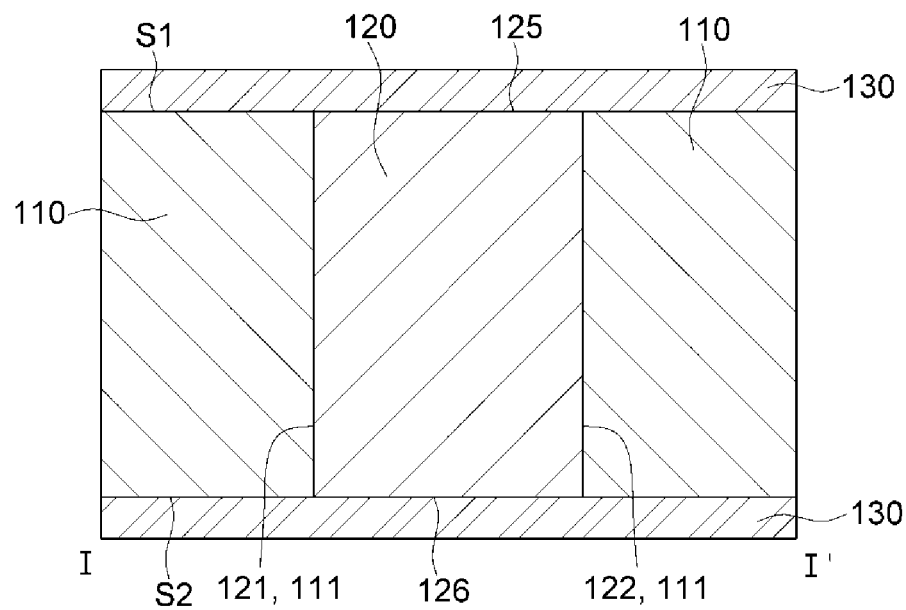
FIG. 14C is a cross-sectional view taken along the line I-I' of FIG. 14A.
Figure 14D:
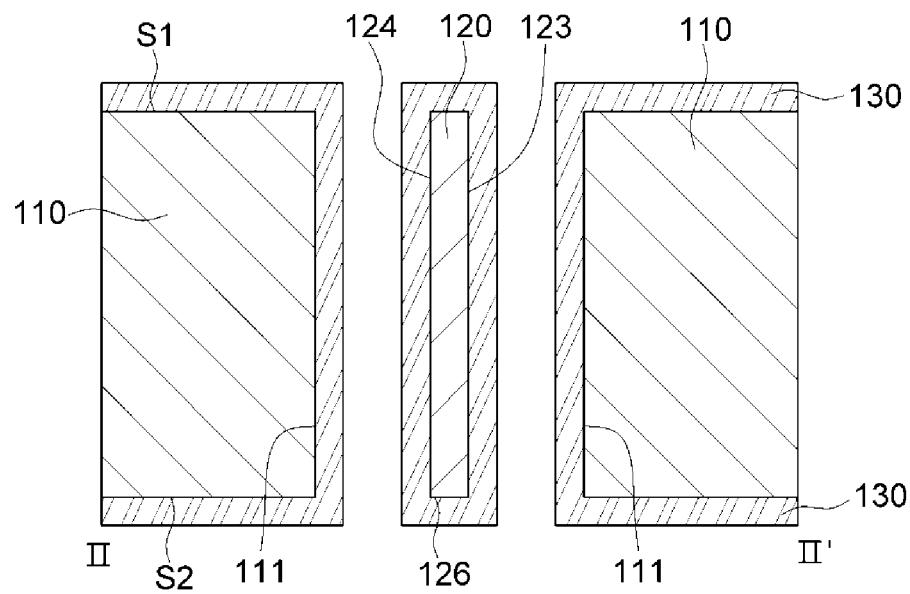
FIG. 14D is a cross-sectional view taken along the line II-II' of FIG. 14A.

FIG. 14A is a perspective view illustrating a through hole and an insulator of a substrate according to a modified embodiment, FIG. 14B is a plan view of FIG. 14A, FIG. 14C is a cross-sectional view taken along the line I-I' of FIG. 14A, and FIG. 14D is a cross-sectional view taken along the line II-II' of FIG. 14A.

According to the present embodiment, an insulating layer 130 may be disposed on the through hole H10 and the insulator 120.

The substrate 110, the through hole H10, and the insulator 120 illustrated in FIGS. 14A-14D are the same as illustrated in FIGS. 6A-6D. However, embodiments of the present disclosure are not limited thereto, and the insulating layer 130 may be applied to the substrate 100, the through hole H1, and the insulator 120 of all the embodiments described above.

The insulating layer 130 is disposed on the inner side surface 111 of the substrate 110 and the third side surface 123 of the insulator 120 that define the first connection hole H11, and defines a third connection hole H15. Accordingly, the insulating layer 130 surrounds the third connection hole H15 in a plan view. In addition, the insulating layer 130 is disposed on the inner side surface 111 of the substrate 110 and the fourth side surface 124 of the insulator 120 that define the second connection hole H12, and defines a fourth connection hole H16. Accordingly, the insulating layer 130 surrounds the fourth connection hole H16 in a plan view. In addition, the insulating layer 130 may be disposed at the first surface S1 and the second surface S2 of the substrate 110 and the upper surface 125 and the lower surface 126 of the insulator 120.

According to the present embodiment, the insulating layer 130 may substantially prevent or protect respective metals filled in each of the connection holes H15 and H16 from being connected to each other through a gap between the inner side surface 111 of the substrate 110 and the first and second side surfaces 121 and 122 of the insulator 120.

Hereinbelow, a method of manufacturing a substrate that includes the substrate 100, the connection wiring CL, the through hole H1, the insulator 120, and the first pad portion PAD1 according to an embodiment will be described in more detail with reference to FIGS. 15A-16C.

Hereinafter, descriptions will be made with respect to the substrate 110, the through hole H10, and the insulator 120 illustrated in FIGS. 6A-6D. However, embodiments of the present disclosure are not limited thereto, and the method may be applied to the substrate, the through hole, the insulator, and the connection hole of all the embodiments described above. In addition, the structure and manufacturing method of the display panel PNL according to an embodiment may also be applied to a PCB. For example, the PCB may include the base film BF, the connection wiring CLP, the through hole H2, an insulator, and the second pad portion PAD2 corresponding to the connection wiring CL, the through hole H1, the insulator 120 and the first pad portion PAD1 of the display panel PNL, respectively.

Figure 15A:
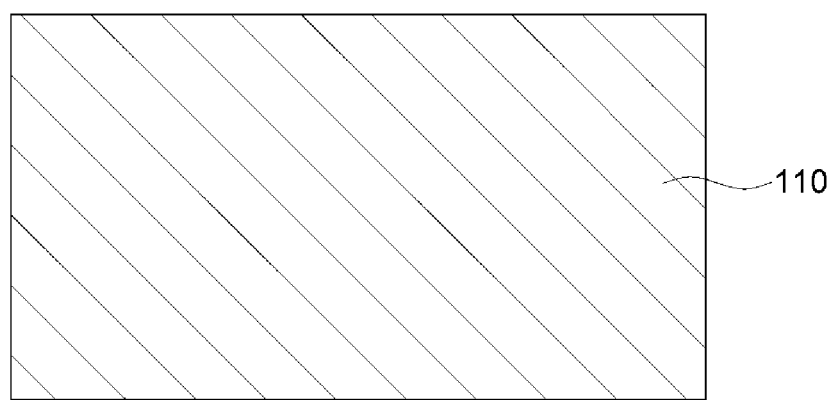
FIGS. 15A-15F are cross-sectional views illustrating a method of manufacturing a substrate according to an embodiment.
Figure 15B:
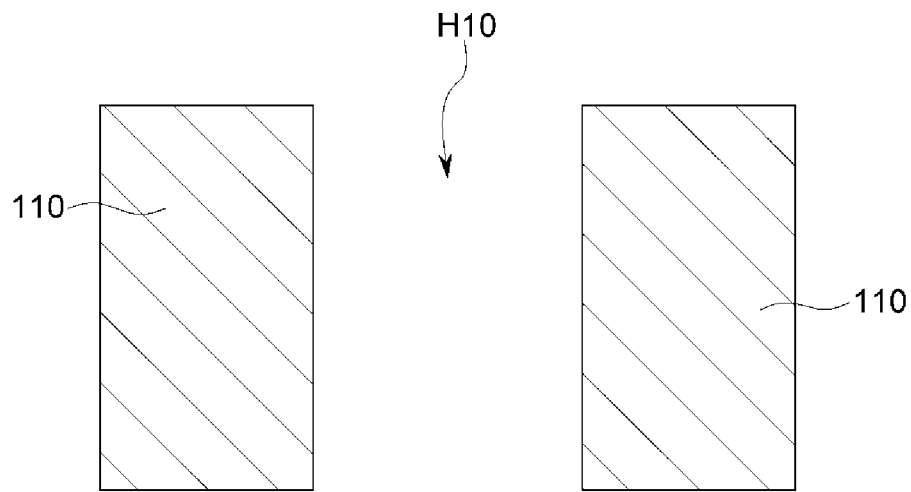
Figure 15C:
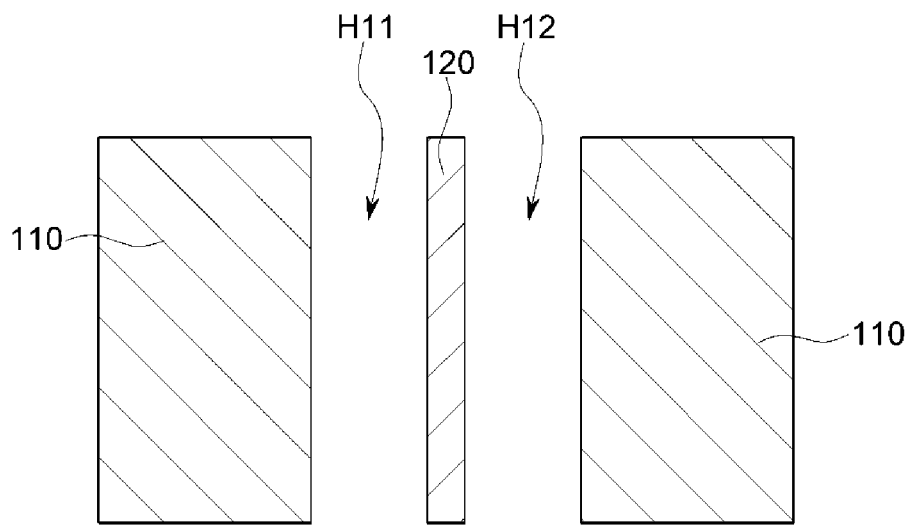
Figure 15D:
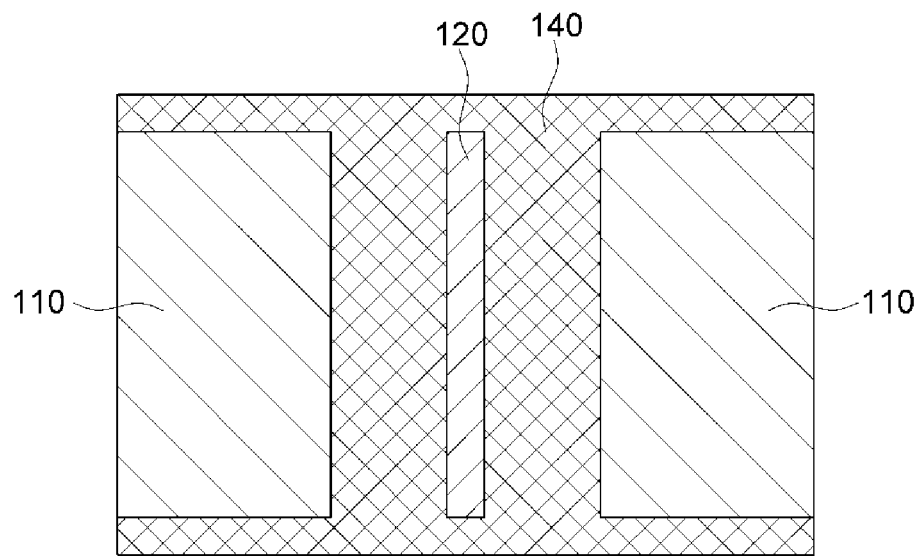
Figure 15E:
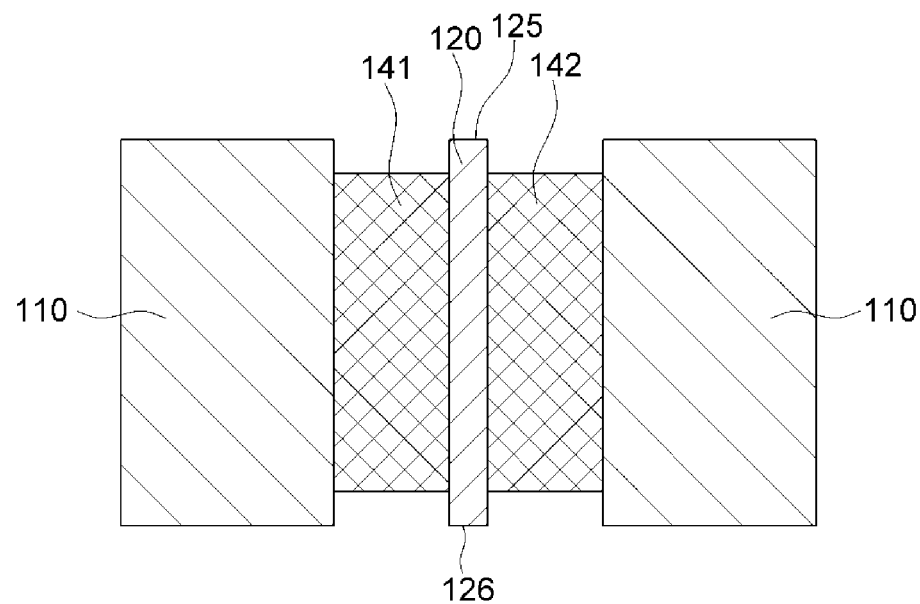
Figure 15F:
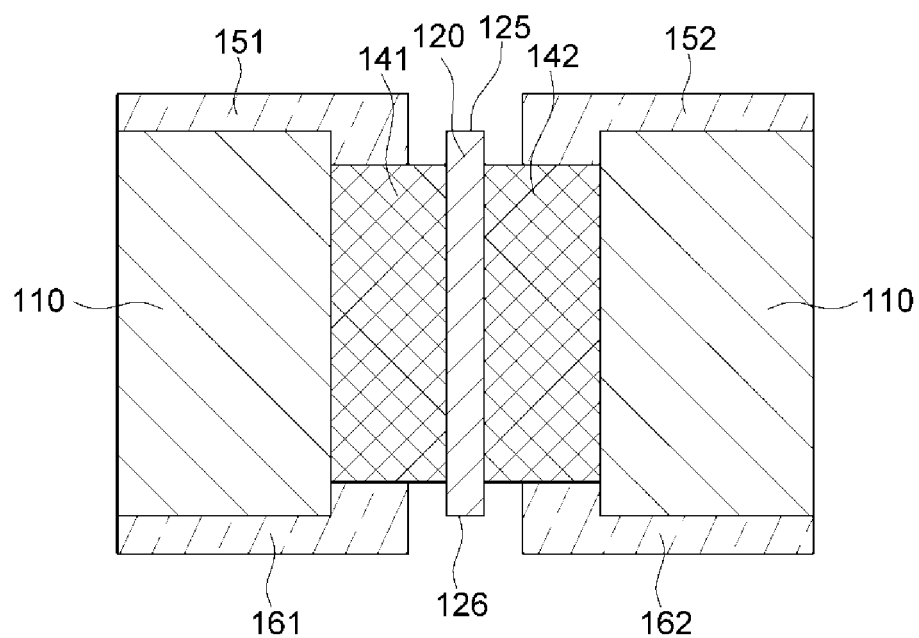
Figure 15G:
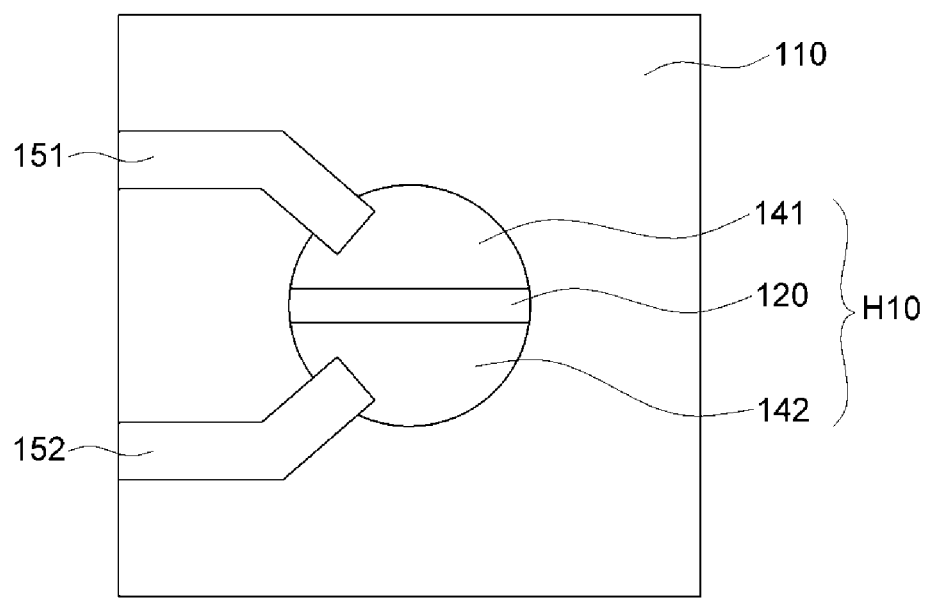
FIG. 15G is a plan view corresponding to FIG. 15F.

FIGS. 15A-15F are cross-sectional views illustrating a method of manufacturing a substrate according to an embodiment, and FIG. 15G is a plan view corresponding to FIG. 15F.

As illustrated in FIG. 15A, the substrate 110 is prepared.

As illustrated in FIG. 15B, the through hole H10 is defined (e.g., formed) at the peripheral area PA of the substrate 110. In such an embodiment, the through hole H10 may be generated by a laser drill. However, embodiments of the present disclosure are not limited thereto, and the through hole H10 may be generated by, for example, cutting, electron beam, grindstone and/or press machining. The through hole H10 may have the shape illustrated in FIGS. 6A-14D.

In an embodiment, the inner side surface of the substrate 110 at which the through hole H10 is defined may include a smear deformed by a laser. Accordingly, a de-smearing process for removing the smear may be further performed after generating the through hole by the laser drill.

As illustrated in FIG. 15C, the insulator 120 is inserted into the through hole H10 defined at the substrate 110 to generate the connection holes H11 and H12. The insulator 120 may have the shape illustrated in FIGS. 6A-14D. After inserting the insulator 120, forming of the insulator layer 130 illustrated in FIGS. 14A-14D may be further performed.

Next, as illustrated in FIG. 15D, the conductor 140 is formed in the connection holes H11 and H12. The conductor 140 may completely fill the connection holes H11 and H12. The conductor 140 may be disposed continuously on the first surface S1 and the second surface S2 of the substrate 110 and on the upper surface 125 and the lower surface 126 of the insulator 120. The conductor 140 may be formed by a method such as evaporation, plating, and/or sputtering. The conductor 140 may have a multi-layer structure formed by plating after sputtering.

Next, as illustrated in FIG. 15E, the conductor 140 formed on the first surface S1 and the second surface S2 of the substrate 110 and on the upper surface 125 and the lower surface 126 of the insulator 120 is removed by an etching process. Accordingly, an integral conductor 140 is divided into a first conductor 141 disposed in the first connection hole H11 and a second conductor 142 disposed in the second connection hole H12. In order to prevent or protect the first and second conductors 141 and 142 from being connected to each other, a height of each of the first and second conductors 141 and 142 may be less than the height of the first and second connection holes H11 and H12.

Next, as illustrated in FIGS. 15F and 15G, wirings 151, 152, 161, and 162 may be formed on the first surface S1 and the second surface S2 of the substrate 110. The wirings 151, 152, 161, and 162 may be formed by laminating a photoresist, and then exposing, developing, and etching the photoresist.

A first wiring 151 extends continuously from an upper surface of the first conductor 141 onto the first surface S1 of the substrate 110. A second wiring 152 extends continuously from an upper surface of the second conductor 142 onto the first surface S1 of the substrate 110. The first and second wirings 151 and 152 are not connected to each other. The first wiring 151 and the first conductor 141 may correspond to the first connection wiring CL1 illustrated in FIGS. 5A-5C, and the second wiring 152 and the second conductor 142 may correspond to the second connection wiring CL2 illustrated in FIGS. 5A and 5C.

A third wiring 161 extends continuously from a lower surface of the first conductor 141 onto the second surface S2 of the substrate 110. A fourth wiring 162 extends continuously from a lower surface of the second conductor 142 onto the second surface S2 of the substrate 110. The third and fourth wirings 161 and 162 are not connected to each other. The third and fourth wirings 161 and 162 correspond to the (1-1)-th pad terminal PAD1-1 and the (1-2)-th pad terminal PAD1-2 of the first pad portion PAD1 illustrated in FIGS. 5A-5C, respectively.

Accordingly, the first wiring 151 on the first surface S1, the first conductor 141 in the first connection hole H11 of the through hole H10, and the third wiring 161 on the second surface S2 are connected to each other, and the second conductor 152 on the second surface S2, the second conductor 142 in the second connection hole H12 of the same through hole H10, and the fourth wiring 162 on the second surface S2 are connected to each other. The first wiring 151, the first conductor 141 and the third wiring 161 (hereinafter, referred to as "wiring A") that are connected to each other are not connected to the second wiring 152, the second conductor 142 and the fourth wiring 162 (hereinafter, referred to as "wiring B") that are connected to each other. Accordingly, the wirings A and B that are separated from each other pass through one through hole H10.

Figure 16A:
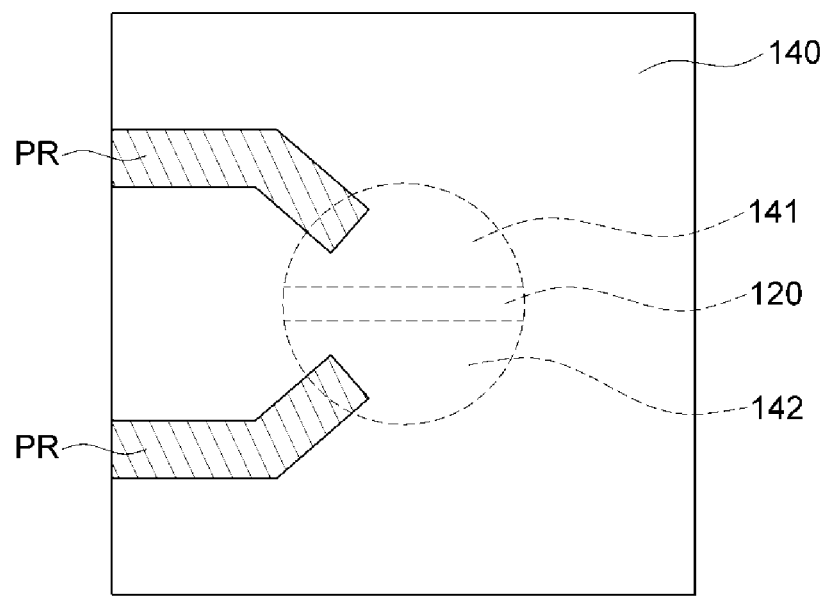
FIG. 16A is a cross-sectional view illustrating a method of manufacturing a substrate according to an embodiment.
Figure 16B:
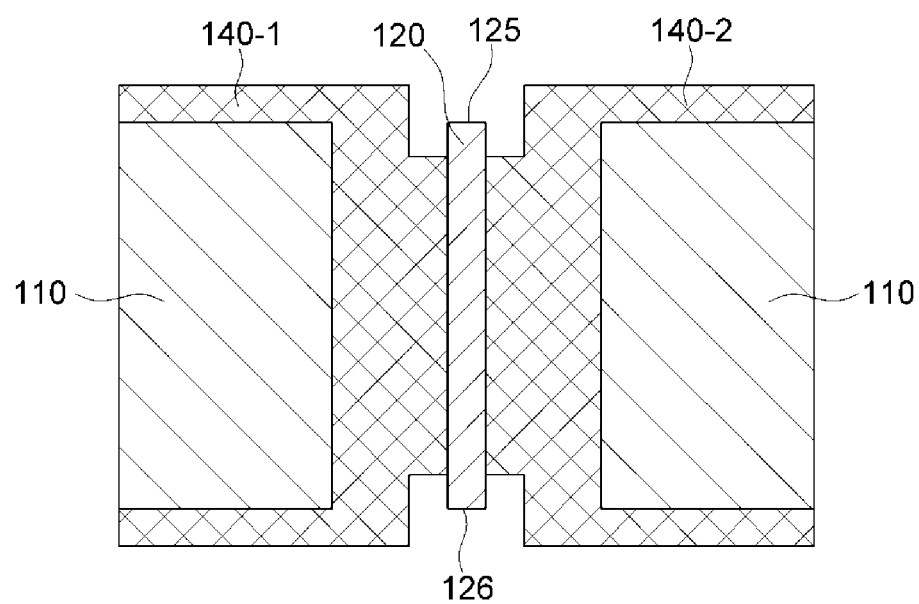
FIGS. 16B and 16C are respectively a cross-sectional view and a plan view illustrating a substrate manufactured in accordance with the method.
Figure 16C:
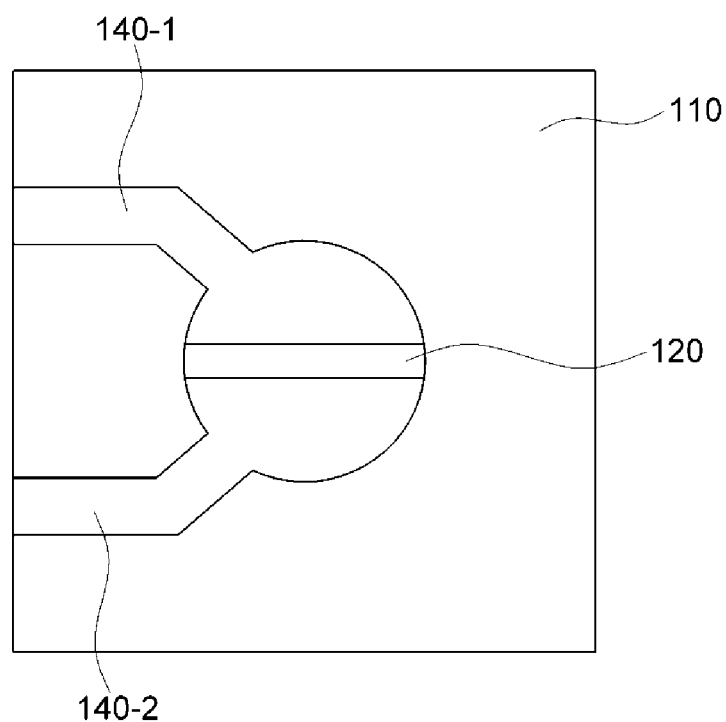

FIG. 16A is a cross-sectional view illustrating a method of manufacturing a substrate according to an embodiment, and FIGS. 16B and 16C are a cross-sectional view and a plan view illustrating a substrate manufactured in accordance with the method, respectively.

The first wiring 151, the first conductor 141 and the third wiring 161 of the wiring A are formed into a unitary portion 140-1, and the second wiring 152, the second conductor 142 and the fourth wiring 162 of the wiring B may be formed into a unitary portion 140-2.

After the conductor 140 is formed as illustrated in FIG. 15D, a photoresist PR corresponding to the shapes of the first and second wirings 151 and 152 is laminated on an upper surface of the conductor 140, and exposed and developed, as illustrated in FIG. 16A.

Next, the conductor 140 is etched until the upper surface 125 of the insulator 120 is exposed, as illustrated in FIGS. 16B and 16C.

A lower surface of the conductor 140 may also be treated in the same manner as above.

Figure 17:
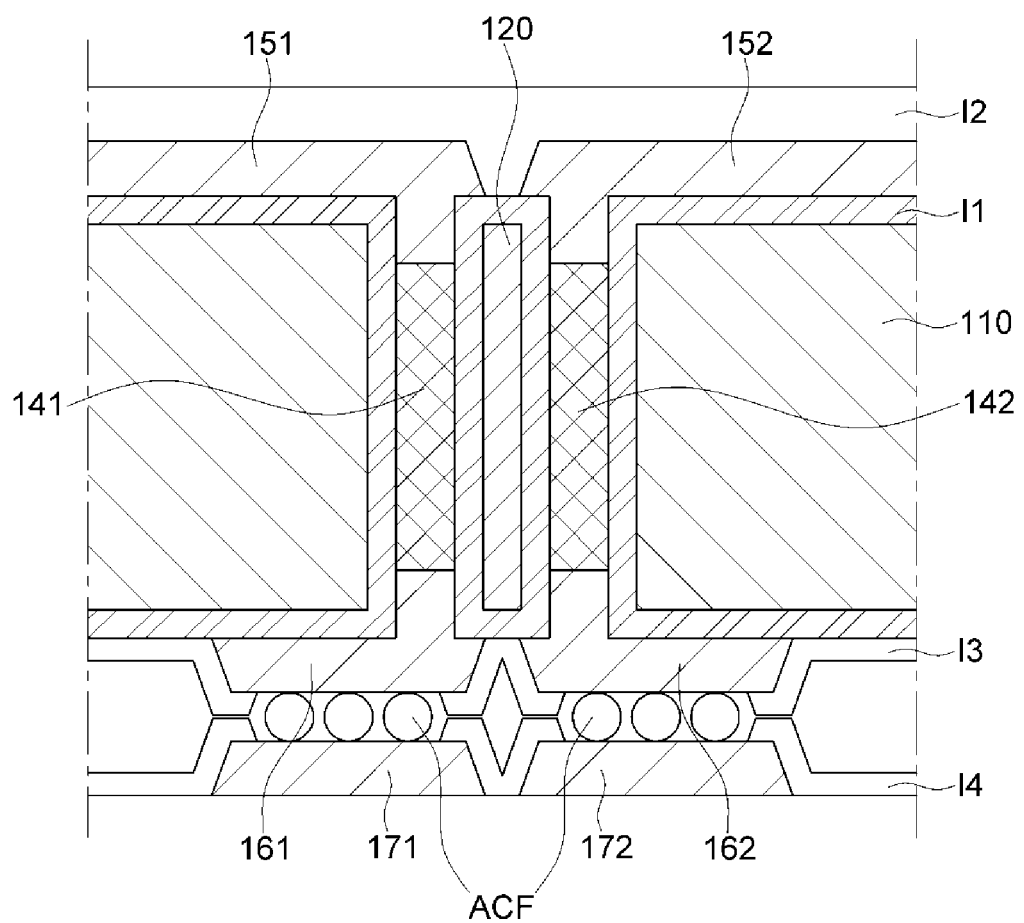
FIGS. 17 and 18 are cross-sectional views respectively illustrating a first pad portion and a second pad portion of a display device according to an embodiment.
Figure 18:
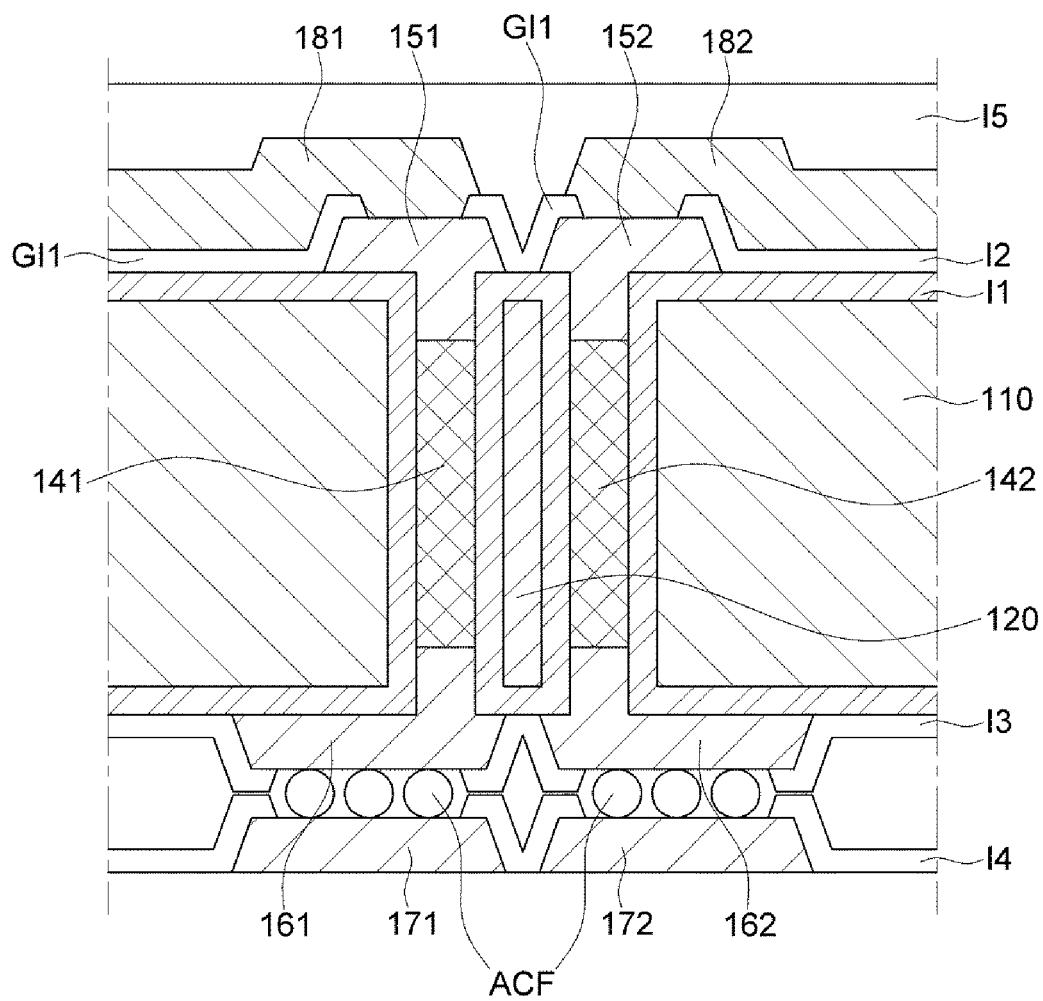

FIGS. 17 and 18 are cross-sectional views illustrating a first pad portion and a second pad portion of a display device according to an embodiment.

The cross-sectional views illustrating the substrates of FIGS. 17 and 18 show the through hole H10 described with reference to FIGS. 14A-14D, but embodiments of the present disclosure are not limited thereto, and the structure may be applied to the substrates of all the embodiments described above.

Referring to FIG. 17, the first insulating layer I1 may correspond to the insulating layer 130 of FIGS. 14A-14D, and may correspond to the first insulating layer GI1 of FIG. 4. The second insulating layer I2 may correspond to the second insulating layer GI2 or the third insulating layer ILD1 of FIG. 4.

The first and second wirings 151 and 152 disposed above the through hole H10 may correspond to the first and second connection wirings CL1 and CL2 of FIG. 1. The first and second wirings 151 and 152 disposed above the through hole H10 may be a metal layer corresponding to the first gate wirings GW1 of FIG. 4, a metal layer corresponding to the second gate wirings GW2, or a metal layer corresponding to the data wirings DW. The third and fourth wirings 161 and 162 disposed below the through hole H10 may correspond to the first pad terminals PAD1-1 and PAD1-2.

Fifth and sixth wirings 171 and 172 that contact the first pad terminals PAD1-1 and PAD1-2 may correspond to the second pad terminals PAD2-1 and PAD2-2 according to the present embodiment. In such an embodiment, a plurality of conductive balls ACF may be disposed between the first pad terminals PAD1-1 and PAD1-2 and the second pad terminals PAD2-1 and PAD2-2, and the first pad terminals PAD1-1 and PAD1-2 and the second pad terminals PAD2-1 and PAD2-2 may be electrically connected to each other through the plurality of conductive balls ACF.

A third insulating layer I3 exposes a part of the first pad terminals PAD1-1 and PAD1-2, and a fourth insulating layer I4 exposes a part of the second pad terminals PAD2-1 and PAD2-2.

Referring to FIG. 18, the first insulating layer I1 may correspond to the insulating layer 130 of FIGS. 14A-14D, and may correspond to the first insulating layer GI1 of FIG. 4. The second insulating layer I2 may correspond to the second insulating layer GI2 of FIG. 4. A fifth insulating layer I5 may correspond to the third insulating layer ILD1 of FIG. 4.

In a case where the gate line disposed at the display area DA is a double-layer gate line, the connection line CL may be disposed as a double-layer gate line. For example, as illustrated in FIG. 18, the connection wiring CL may include the first gate wiring GW1 and the second gate wiring GW2 illustrated in FIG. 4. In such an embodiment, the connection wiring CL may include the first and second wirings 151 and 152 corresponding to the first gate wiring GW1, and the seventh and eighth wirings 181 and 182 corresponding to the second gate wiring GW2.

As set forth hereinabove, according to one or more embodiments, by dividing a through hole into two or more connection holes that are separated from each other, the number of connection wirings that may be connected through the same number of through holes may be at least doubled, and accordingly, a density of the connection wirings may be increased.

The use of "may" when describing embodiments of the present disclosure refers to "one or more embodiments of the present disclosure." Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the present invention has been illustrated and described with reference to the embodiments thereof, it will be apparent to those of ordinary skill in the art that various changes in form and detail may be made thereto without departing from the spirit and scope of the present invention, as hereinafter claimed. Furthermore, the scope of the present disclosure is to be determined by the broadest permissible interpretation of the following claims and their equivalents, and shall not be restricted or limited by the foregoing detailed description.

What is claimed is:

1. A display device comprising:
a substrate having a first surface, a second surface opposite to the first surface, and an inner side surface defining a plurality of through holes;
a first wiring and a second wiring both on the first surface; and
a first conductor and a second conductor both in one of the plurality of through holes,
wherein the first conductor is connected to the first wiring,
the second conductor is connected to the second wiring, and
the first and second conductors are insulated from each other.

2. The display device of claim 1, wherein the substrate comprises a display area at which a plurality of pixels arranged and a peripheral area around the display area at which pixels are not arranged,
the through hole is at the peripheral area, and
the first and second wirings are connected to the plurality of pixels.

3. The display device of claim 1, further comprising a printed circuit board on the second surface, and
the first and second conductors are connected to the printed circuit board.

4. The display device of claim 1, further comprising a third wiring and a fourth wiring on the second surface,
the first conductor is connected to the third wiring, and
the second conductor is connected to the fourth wiring.

5. The display device of claim 1, further comprising an insulator in the through hole and dividing the through hole in a plan view.

6. The display device of claim 5, wherein the insulator has an upper surface and a lower surface, each being parallel to the first surface of the substrate, first and second side surfaces contacting the inner side surface of the substrate, and third and fourth side surfaces facing the inner side surface of the substrate.

7. The display device of claim 6, wherein a distance between the upper surface and the lower surface of the insulator is substantially equal to a distance between the first surface and the second surface of the substrate.

8. The display device of claim 6, wherein a distance between the upper surface and the lower surface of the insulator is greater than a distance between the first surface and the second surface of the substrate.

9. The display device of claim 6, wherein the through hole comprises:
   a first connection hole defined by the third side surface of the insulator and the inner side surface of the substrate; and
   a second connection hole defined by the fourth side surface of the insulator and the inner side surface of the substrate,
   the first conductor is in the first connection hole, and
   the second conductor is in the second connection hole.

10. The display device of claim 6, wherein the display device further comprises:
    an insulating layer on the third side surface of the insulator, the fourth side surface of the insulator, and the inner side surface of the substrate,
    the through hole comprises:
    a third connection hole defined by the third side surface of the insulator and the insulating layer on the inner side surface of the substrate; and
    a fourth connection hole defined by the fourth side surface of the insulator and the insulating layer on the inner side surface of the substrate,
    the first conductor is in the third connection hole, and
    the second conductor is in the fourth connection hole.

11. The display device of claim 5, wherein the insulator comprises:
    a first portion extending from a center of the through hole in a first direction and contacts the inner side surface of the substrate in a plan view; and
    a second portion extending from the center of the through hole in a second direction different from the first direction, and contacts the inner side surface of the substrate in a plan view.

12. The display device of claim 11, wherein the first direction and the second direction are opposite to each other.

13. The display device of claim 11, wherein the insulator further comprises:
    a third portion extending from the center of the through hole in a third direction different from the first and second directions, and contacts the inner side surface of the substrate in a plan view.

14. The display device of claim 13, wherein the insulator further comprises:
    a fourth portion extending from the center of the through hole in a fourth direction different from the first, second, and third directions, and contacts the inner side surface of the substrate in a plan view.

15. The display device of claim 11, wherein the inner side surface of the substrate has a shape of an ellipse in a plan view, and
    the first and second directions are parallel to a major axis direction of the ellipse.

16. The display device of claim 11, wherein the inner side surface of the substrate has a shape of a circle in a plan view.

17. The display device of claim 5, wherein a side surface of the insulator contacting the inner side surface of the substrate comprises a protruding portion protruding toward the substrate in a plan view.

18. The display device of claim 1, wherein the inner side surface of the substrate is perpendicular to the first surface and the second surface in a cross-sectional view.

19. The display device of claim 1, wherein the inner side surface of the substrate is inclined with respect to the first surface and the second surface in a cross-sectional view.

20. The display device of claim 1, wherein the inner side surface of the substrate defining the through hole has a convex shape in a cross-sectional view.

21. A substrate having a first surface, a second surface opposite to the first surface, and an inner side surface defining a plurality of through holes, the substrate comprising:
    a first wiring and a second wiring both on the first surface;
    a third wiring and a fourth wiring both on the second surface;
    an insulator in the through hole and dividing the through hole in a plan view; and
    a first conductor and a second conductor both in one of the plurality of through holes and insulated from each other by the insulator,
    wherein the first conductor connects the first wiring and the third wiring, and
    the second conductor connects the second wiring and the fourth wiring.

22. The substrate of claim 21, wherein the substrate is a printed circuit board.

23. The substrate of claim 21, wherein the substrate is a substrate of a display panel.

* * * * *